(12) United States Patent
Yoon et al.

(10) Patent No.: US 10,741,607 B2
(45) Date of Patent: Aug. 11, 2020

(54) IMAGE SENSING APPARATUS AND MANUFACTURING METHOD THEREOF

(71) Applicant: SAMSUNG ELECTRONICS CO., LTD., Suwon-si, Gyeonggi-do (KR)

(72) Inventors: Sung Hyun Yoon, Seoul (KR); Doo Won Kwon, Seongnam-si (KR); Kwan Sik Kim, Seoul (KR); In Gyu Baek, Seoul (KR); Tae Young Song, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 29 days.

(21) Appl. No.: 15/968,954

(22) Filed: May 2, 2018

(65) Prior Publication Data
US 2019/0103425 A1   Apr. 4, 2019

(30) Foreign Application Priority Data

Sep. 29, 2017  (KR) .................. 10-2017-0127985

(51) Int. Cl.
*H01L 27/32*   (2006.01)
*H01L 27/146*   (2006.01)
(Continued)

(52) U.S. Cl.
CPC ........ *H01L 27/1469* (2013.01); *H01L 21/568* (2013.01); *H01L 21/6835* (2013.01);
(Continued)

(58) Field of Classification Search
CPC .................. H01L 27/3269; H01L 27/146
See application file for complete search history.

(56) References Cited

U.S. PATENT DOCUMENTS 7,883,991 B1   2/2011   Wu et al.
8,669,179 B2   3/2014   Akram et al.
(Continued)

FOREIGN PATENT DOCUMENTS

CN   1893565 A   1/2007
JP   2001094038 A   4/2001
(Continued)

OTHER PUBLICATIONS

Japanese Office Action dated Nov. 5, 2019.
IOS Invitation to Respond to Written Opinion/ Search Report, dated Aug. 14, 2018.

*Primary Examiner* — Moazzam Hossain
*Assistant Examiner* — Hajar Kolahdouzan
(74) *Attorney, Agent, or Firm* — Lee IP Law, PC

(57) ABSTRACT

A method of manufacturing an image sensing apparatus includes: forming a first substrate structure including a first region of a pixel region, the first substrate structure having a first surface and a second surface; forming a second substrate structure including a circuit region for driving the pixel region, the second substrate structure having a third surface and a fourth surface; bonding the first substrate structure to the second substrate structure, such that the first surface is connected to the third surface; forming a second region of the pixel region on the second surface; forming a first connection via, the first connection via extending from the second surface to pass through the first substrate structure; mounting semiconductor chips on the fourth surface, using a conductive bump; and separating a stack structure of the first substrate structure, the second substrate structure, and the semiconductor chips into unit image sensing apparatuses.

20 Claims, 28 Drawing Sheets

(51) Int. Cl.
  *H01L 21/56* (2006.01)
  *H01L 21/683* (2006.01)
  *H01L 21/768* (2006.01)
  *H01L 23/522* (2006.01)
  *H01L 23/528* (2006.01)
  *H01L 31/18* (2006.01)
  *H01L 23/00* (2006.01)

(52) U.S. Cl.
  CPC ...... *H01L 21/76898* (2013.01); *H01L 23/528* (2013.01); *H01L 23/5226* (2013.01); *H01L 27/14618* (2013.01); *H01L 27/14623* (2013.01); *H01L 27/14634* (2013.01); *H01L 27/14636* (2013.01); *H01L 27/14685* (2013.01); *H01L 31/1892* (2013.01); *H01L 24/13* (2013.01); *H01L 24/81* (2013.01); *H01L 24/97* (2013.01); *H01L 27/1463* (2013.01); *H01L 27/14621* (2013.01); *H01L 27/14627* (2013.01); *H01L 2221/6834* (2013.01); *H01L 2221/68327* (2013.01); *H01L 2221/68359* (2013.01); *H01L 2224/06517* (2013.01); *H01L 2224/09517* (2013.01); *H01L 2224/13111* (2013.01); *H01L 2224/16148* (2013.01); *H01L 2224/80895* (2013.01); *H01L 2224/80896* (2013.01); *H01L 2224/81005* (2013.01); *H01L 2224/97* (2013.01); *H01L 2924/1431* (2013.01); *H01L 2924/1434* (2013.01); *H01L 2924/181* (2013.01); *H01L 2924/18161* (2013.01)

(56) References Cited

U.S. PATENT DOCUMENTS

| | | |
|---|---|---|
| 8,946,610 B2 | 2/2015 | Iwabuchi et al. |
| 9,087,759 B1 | 7/2015 | Yang |
| 9,406,713 B2 | 8/2016 | Fan |
| 2005/0029643 A1 | 2/2005 | Koyanagi |
| 2005/0151228 A1 | 7/2005 | Tanida et al. |
| 2006/0027841 A1 | 2/2006 | Tamaki |
| 2006/0091487 A1 | 5/2006 | Hanada et al. |
| 2011/0233702 A1* | 9/2011 | Takahashi ......... H01L 27/14638 257/432 |
| 2013/0113065 A1 | 5/2013 | Qian et al. |
| 2014/0035089 A1 | 2/2014 | Qian et al. |
| 2014/0327061 A1 | 11/2014 | Lee |
| 2015/0077590 A1 | 3/2015 | Kuriyama et al. |
| 2015/0087088 A1 | 3/2015 | Fujimori et al. |
| 2015/0091124 A1 | 4/2015 | Liu et al. |
| 2015/0270307 A1 | 9/2015 | Umebayashi et al. |
| 2015/0279897 A1 | 10/2015 | Yang |
| 2016/0197114 A1 | 7/2016 | Chuang et al. |
| 2016/0284753 A1 | 9/2016 | Komai et al. |
| 2016/0373629 A1 | 12/2016 | Jung et al. |
| 2016/0380032 A1 | 12/2016 | Park et al. |
| 2017/0154913 A1 | 6/2017 | Jun |
| 2017/0179181 A1 | 6/2017 | Kwon |
| 2018/0166490 A1 | 6/2018 | Wakiyama et al. |

FOREIGN PATENT DOCUMENTS

| | | |
|---|---|---|
| JP | 2001339057 A | 12/2001 |
| JP | 2005-167093 A | 6/2005 |
| JP | 200649569 | 2/2006 |
| JP | 2007165454 A | 6/2007 |
| JP | 2014099582 A | 5/2014 |
| JP | 2015135938 | 7/2015 |
| JP | 2016171297 | 9/2016 |
| JP | 2017-11273 A | 1/2017 |
| JP | 2017-034499 A | 2/2017 |
| WO | WO 03/041174 A1 | 5/2003 |
| WO | WO 2013/145765 A1 | 10/2013 |

\* cited by examiner

IMAGE SENSING APPARATUS AND MANUFACTURING METHOD THEREOF

CROSS-REFERENCE TO RELATED APPLICATION

Korean Patent Application No. 10-2017-0127985 filed on Sep. 29, 2017, in the Korean Intellectual Property Office, and entitled: "Image Sensing Apparatus and Manufacturing Method Thereof," is incorporated by reference herein in its entirety.

BACKGROUND

1. Field

Embodiments relate to an image sensing apparatus and a manufacturing method thereof.

2. Description of Related Art

Image sensing apparatuses, capturing images and converting images into electrical signals, have been used in cameras mounted in automobiles, security devices, and robots, as well as consumer electronics, such as digital cameras, camera modules for mobile phones, and portable camcorders.

SUMMARY

Embodiments are directed to a method of manufacturing an image sensing apparatus, including forming a first substrate structure including a first region of a pixel region, the first substrate structure having a first surface and a second surface opposite the first surface; forming a second substrate structure including a circuit region for driving the pixel region, the second substrate structure having a third surface and a fourth surface opposite the third surface; bonding the first substrate structure to the second substrate structure, such that the first surface of the first substrate structure is connected to the third surface of the second substrate structure; forming a second region of the pixel region on the second surface of the first substrate structure; forming a first connection via, the first connection via extending from the second surface of the first substrate structure to pass through the first substrate structure; mounting semiconductor chips on the fourth surface of the second substrate structure, using a conductive bump; and separating a stack structure of the first substrate structure, the second substrate structure, and the semiconductor chips into unit image sensing apparatuses.

Embodiments may also provide a method of manufacturing an image sensing apparatus, including forming a first substrate structure including a photoelectric conversion element in a pixel region, the first substrate structure having a first surface and a second surface opposite the first surface; forming a second substrate structure including a circuit region for driving the pixel region, the second substrate structure having a third surface and a fourth surface opposite the third surface; bonding the first substrate structure to the second substrate structure, such that the first surface of the first substrate structure is connected to the third surface of the second substrate structure; forming a color filter and a microlens of the pixel region on the second surface of the first substrate structure; and mounting semiconductor chips on the fourth surface of the second substrate structure, using a conductive bump.

Embodiments may also provide a method of manufacturing an image sensing apparatus, including forming a stack structure of a first substrate structure and a second substrate structure, the first substrate structure including a pixel region, and the second substrate structure including a circuit region for driving the pixel region; bonding a carrier substrate to one surface of the first substrate structure; removing a portion of the second substrate structure from one surface of the second substrate structure; forming a redistribution layer and a conductive connection pad on the redistribution layer, on the one surface of the second substrate structure; connecting semiconductor chips on the one surface of the second substrate structure, using a conductive bump; forming an encapsulation portion, the encapsulation portion encapsulating the semiconductor chips; removing the carrier substrate from the one surface of the first substrate structure; and separating a stack structure of the first substrate structure, the second substrate structure, and the semiconductor chips into unit image sensing apparatuses.

Embodiments may also provide an image sensing apparatus, including a first substrate structure including a pixel region, the pixel region having a photoelectric conversion element; a second substrate structure having a first surface connected to the first substrate structure, and a second surface opposite the first surface, the second substrate structure including a circuit region, and the circuit region being electrically connected to the pixel region through a first connection via to drive the pixel region, the first connection via passing through the first substrate structure; and a memory chip mounted on the second surface of the second substrate structure, connected to the second substrate structure by a conductive bump, and electrically connected to the circuit region through a second connection via, the second connection via extending from the second surface of the second substrate structure to pass through a portion of the second substrate structure.

Embodiments may also provide an image sensing apparatus, including a first substrate structure including a pixel region, the pixel region having a photoelectric conversion element; a second substrate structure including a circuit region, the circuit region being electrically connected to the pixel region of the first substrate structure to drive the pixel region; and at least one semiconductor chip mounted on the second substrate structure, connected to the second substrate structure by a conductive bump, and electrically connected to the circuit region through a second connection via, the second connection via passing through a portion of the second substrate structure.

BRIEF DESCRIPTION OF DRAWINGS

Features will become apparent to those of skill in the art by describing in detail example embodiments with reference to the attached drawings in which.

DETAILED DESCRIPTION

Figure 1:
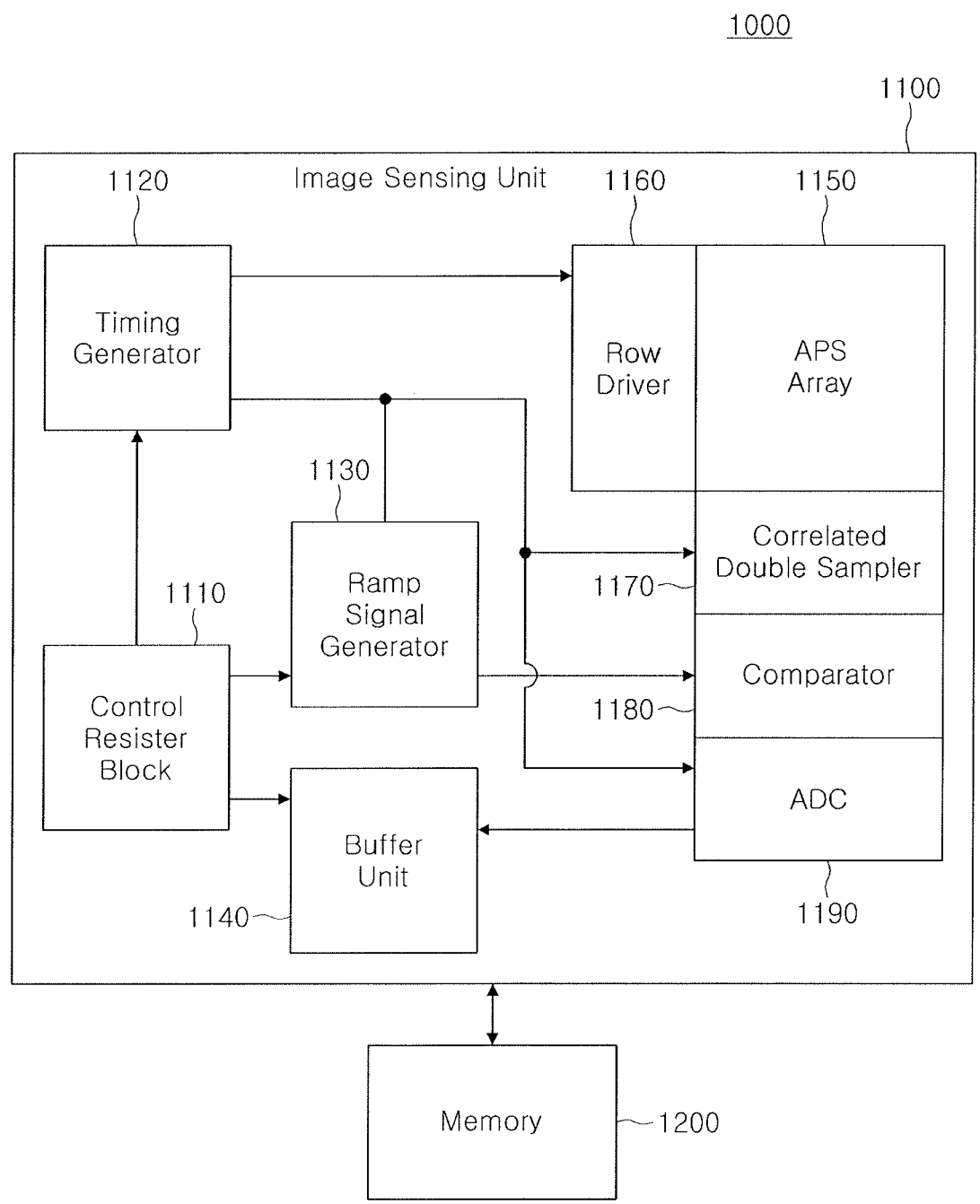
FIG. 1 illustrates a schematic block diagram of an image sensing apparatus, according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

The terms "upper," "upper portion," "upper surface," "lower," "lower portion," "lower surface," and "side surface" may be understood below on the basis of directions depicted in the drawings appended hereto, except in the case that they are indicated by the reference denotations and referenced separately.

FIG. 1 illustrates a schematic block diagram of an image sensing apparatus, according to example embodiments.

Referring to FIG. 1, an image sensing apparatus 1000 may include an image sensing unit 1100 and a memory 1200.

The image sensing unit 1100 may include a control register block 1110, a timing generator 1120, a ramp signal generator 1130, a buffer unit 1140, an active pixel sensor (APS) array 1150, a row driver 1160, a correlated double sampler 1170, a comparator 1180, and an analog-to-digital converter (ADC) 1190.

The control register block 1110 may control the overall operations of the image sensing unit 1100. For example, the control register block 1110 may directly transmit operating signals to the timing generator 1120, the ramp signal generator 1130, and the buffer unit 1140. The timing generator 1120 may generate an operating timing reference signal for the various components of the image sensing unit 1100. The operating timing reference signal, generated by the timing generator 1120, may be transmitted to the row driver 1160, the correlated double sampler 1170, the comparator 1180, and/or the ADC 1190. The ramp signal generator 1130 may generate and transmit a ramp signal used in the correlated double sampler 1170 and/or the comparator 1180. The buffer unit 1140 may include a latch portion. The buffer unit 1140 may temporarily store an image signal to be transmitted to an external source, and may transmit the image data to the memory 1200 and an external device.

The APS array 1150 may sense an external image. The APS array 1150 may include a plurality of active pixels. The row driver 1160 may selectively activate rows of the APS array 1150. The correlated double sampler 1170 may sample and output an analog signal generated from the APS array 1150. The comparator 1180 may compare data, transmitted from the correlated double sampler 1170, to a slope of a ramp signal, and the like, fed back according to analog reference voltages thereof, to generate various reference signals. The ADC 1190 may convert analog image data into digital image data.

The memory 1200 may receive image data from the image sensing unit 1100, store or process the received image data, and transmit the processed image data to the image sensing unit 1100. The memory 1200 may include a memory element, such as a dynamic random access memory (DRAM) element, a static random access memory (SRAM) element, a spin-transfer torque magnetic random-access memory (STT-MRAM) element, or a flash memory element. When the memory 1200 includes a DRAM element, the memory 1200 may receive image data at a relatively high speed and process the received image data.

Figure 2:
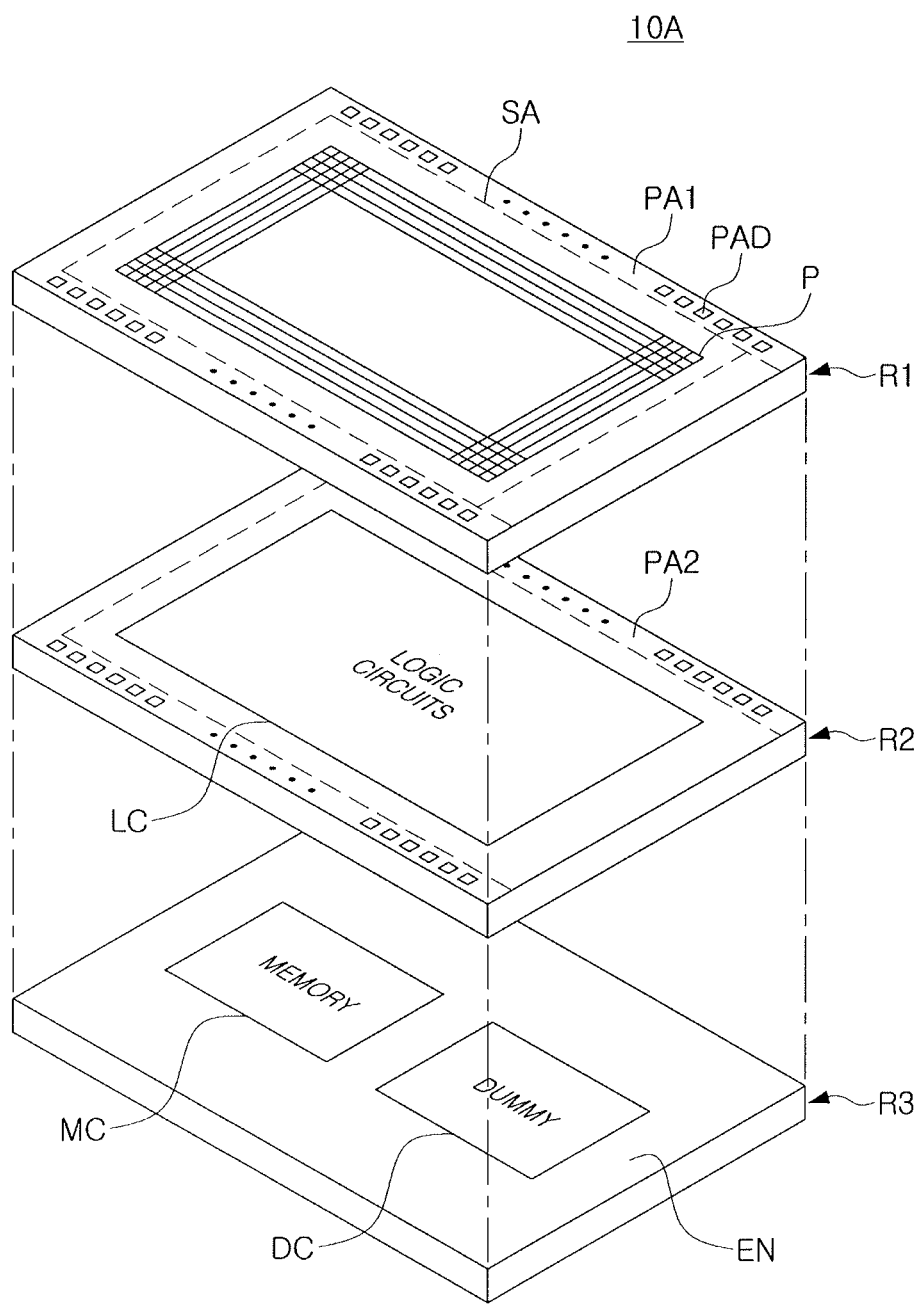
FIG. 2 illustrates a schematic layout of an image sensing apparatus, according to example embodiments.

FIG. 2 illustrates a schematic layout of an image sensing apparatus, according to example embodiments.

Referring to FIG. 2, an image sensing apparatus 10A may include first to third regions R1 to R3 stacked in a vertical direction. The first and second regions R1 and R2 may constitute the image sensing unit 1100 of FIG. 1, and the third region R3 may constitute the memory 1200 of FIG. 1.

The first region R1 may include a sensor array region SA and a first pad region PA1, and the second region R2 may include a logic circuit region LC and a second pad region PA2. The third region R3 may include a memory chip MC and a dummy chip DC. The first to third regions R1 to R3 may be sequentially stacked in the vertical direction.

In the first region R1, the sensor array region SA may be a region corresponding to the APS array 1150, described above with reference to FIG. 1. The sensor array region SA may include a plurality of unit pixels P arranged in a matrix. Each unit pixel P may include, for example, a photodiode and transistors. An example embodiment of the unit pixel P will be described below in more detail, with reference to FIGS. 5A through 6B.

The first pad region PA1 may include a plurality of pads PAD, and may be disposed, for example, around the sensor array region SA. The pads PAD may be configured to transmit an electrical signal to, or to receive an electrical signal from, an external device or the like.

In the second region R2, the logic circuit region LC may be implemented as, for example, electronic elements including a plurality of transistors. The logic circuit region LC may be configured to be electrically connected to the sensor array region SA to provide a predetermined signal to each unit pixel P of the sensor array region SA or to control a signal output therefrom.

The logic circuit region LC may include regions corresponding to, for example, the control register block 1110, the timing generator 1120, the ramp signal generator 1130, the buffer unit 1140, the row driver 1160, the correlated double sampler 1170, the comparator 1180, and the ADC 1190. For example, the logic circuit region LC may include the regions, except for the APS array 1150, in the image sensing unit 1100 of FIG. 1. The second region R2 may include the second pad region PA2 in a region corresponding to the first pad region PA1 of the first region R1.

In the third region R3, the memory chip MC may be encapsulated by an encapsulation portion EN. In an implementation, the memory chip MC may be encapsulated together with the dummy chip DC by the encapsulation portion EN. The first and second regions R1 and R2 may be a semiconductor wafer-based structure. In contrast, the third region R3 may be a structure including a semiconductor chip. The memory chip MC may be electrically connected to the logic circuit region LC of the second region R2 to transmit or receive image data. The dummy chip DC may be selectively disposed outside the region in which the memory chip MC may be disposed, and may perform, for example, a heat dissipation function.

Figure 3:
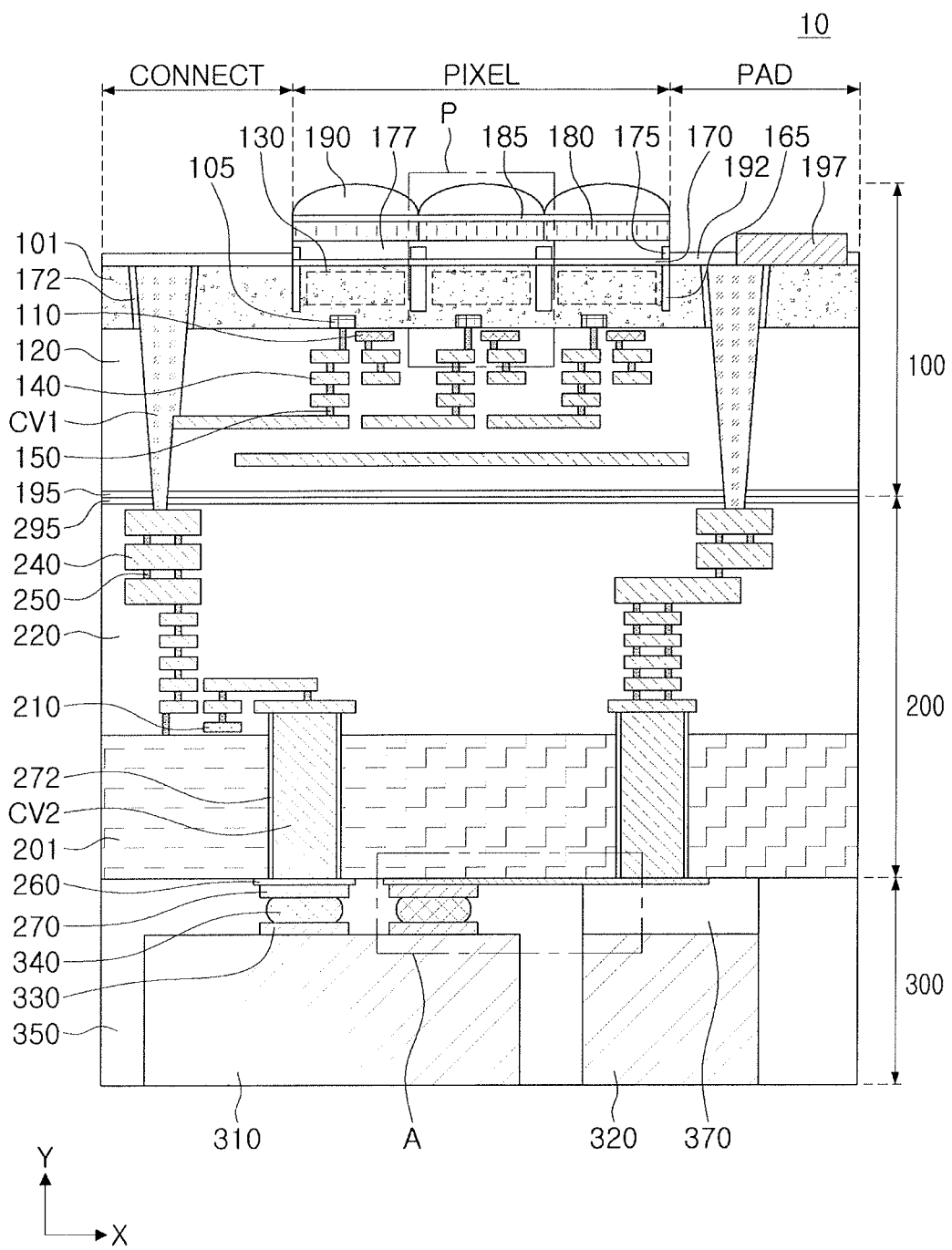
FIG. 3 illustrates a schematic cross-sectional view of an image sensing apparatus, according to example embodiments.

FIG. 3 illustrates a schematic cross-sectional view of an image sensing apparatus, according to example embodiments.

Referring to FIG. 3, an image sensing apparatus 10 may include a first substrate structure 100, a second substrate structure 200, and a third chip structure 300 stacked in one direction, for example, a y direction. The first substrate structure 100 may include pixels, the second substrate structure 200 may include a circuit driving the pixels, and the third chip structure 300 may include a memory chip connected to the circuit. The first substrate structure 100, the second substrate structure 200, and the third chip structure 300 may correspond to the first region R1, the second region R2, and the third region R3, described above with reference to FIG. 2, respectively.

The first substrate structure 100 may include a pixel region PIXEL having pixels P arranged in a matrix, a pad region PAD having pads in a pad layer 197 therein to transmit an electrical signal to, or to receive an electrical signal from, an external device or the like, and a connection region CONNECT electrically connecting the pixel region PIXEL of the first substrate structure 100 to the second substrate structure 200 disposed below the first substrate structure 100. In FIG. 3, only a portion of each of the pixel region PIXEL, the pad region PAD, and the connection region CONNECT is illustrated selectively and schematically, for the purpose of description. The first substrate structure 100 may include a first substrate 101, a first interlayer insulating layer 120, and a first bonding layer 195.

The first substrate 101 may be, for example, a semiconductor substrate. For example, the first substrate 101 may be a p-type silicon substrate. In example embodiments, the first substrate 101 may include a p-type bulk substrate and a p- or n-type epitaxial layer grown thereon. In another implementation, the first substrate 101 may include an n-type bulk substrate and a p- or n-type epitaxial layer grown thereon. In another implementation, the first substrate 101 may be an organic plastic substrate.

The first interlayer insulating layer 120 may be formed of, for example, an insulating material, and may include one or more layers. For example, the first interlayer insulating layer 120 may include a silicon oxide and/or a silicon nitride.

The first bonding layer 195 may be a layer for bonding the first substrate structure 100 to the second substrate structure 200. The first bonding layer 195 may be formed of an insulating material, for example, one or more of SiO, SiN, SiCN, SiOC, SiON, or SiOCN.

The pixel region PIXEL may include storage node regions 105 and photodiodes 130 disposed within the first substrate 101, pixel gate layers 110, first wiring layers 140, and first vias 150 disposed within the first interlayer insulating layer 120, and color filters 180 and microlenses 190 disposed above the first substrate 101. The pixel region PIXEL may further include pixel isolation regions 165 disposed within the first substrate 101, and a buffer layer 170, grids 175, a lower planarization layer 177, and an upper planarization layer 185 disposed on the first substrate 101. An example structure of the pixel region PIXEL will be described below in more detail, with reference to FIGS. 5A through 6B.

The pad region PAD and the connection region CONNECT may be disposed around the pixel region PIXEL, and may include an upper insulating layer 192 disposed on the first substrate 101, first connection vias CV1 passing through the first substrate 101 and the first interlayer insulating layer 120, and a first via insulating layer 172 disposed on a portion of a side wall of each of the first connection vias CV1. The pad region PAD may further include a pad layer 197 disposed on the first substrate 101, such that the pad layer 197 may be exposed by the upper insulating layer 192.

The upper insulating layer 192 may be formed of an insulating material, for example, a silicon oxide and/or a silicon nitride. The pad layer 197 may be formed of a conductive material, for example, one or more of tungsten (W), copper (Cu), aluminum (Al), gold (Au), silver (Ag), or an alloy thereof.

The first connection via CV1 may electrically connect the first substrate structure 100 to the second substrate structure 200. The first connection via CV1 may pass through the entirety of the first substrate 101 and the first interlayer insulating layer 120, and may extend up to a portion of a second interlayer insulating layer 220 of the second substrate structure 200. The first connection via CV1 may be connected to second wiring layers 240 disposed within the second interlayer insulating layer 220 on a lower portion of the first connection via CV1. The first connection via CV1 may be connected to the first wiring layers 140 disposed within the first interlayer insulating layer 120. In the pad region PAD, the first connection via CV1 may be connected to the pad layer 197 on an upper portion thereof. The first connection via CV1 may have a cylindrical shape, may have a width narrowing from the upper portion thereof to the lower portion thereof. The first connection via CV1 may be formed of a conductive material, for example, one or more of tungsten (W), copper (Cu), aluminum (Al), gold (Au), silver (Ag), or an alloy thereof.

The first via insulating layer 172 may be disposed within the first substrate 101 to electrically isolate the first substrate 101 from the first connection via CV1. As illustrated in FIG. 3, the first via insulating layer 172 may be in contact with the first connection via CV1. In example embodiments, the first via insulating layer 172 may also be spaced from the first connection via CV1. The first via insulating layer 172 may be formed of an insulating material, for example, a silicon oxide and/or a silicon nitride.

The second substrate structure 200 may include a second substrate 201, the second interlayer insulating layer 220, and a second bonding layer 295. The second substrate structure 200 may further include circuit gate layers 210, second wiring layers 240, and second vias 250 disposed within the second interlayer insulating layer 220, and second connection vias CV2 and second via insulating layers 272 disposed within the second substrate 201. The second substrate structure 200 may further include first redistribution layers 260 and first connection pads 270 disposed on a lower surface of the second substrate 201.

The second substrate 201 may be a semiconductor substrate. For example, the second substrate 201 may include a semiconductor material, such as a Group IV semiconductor material. For example, a Group IV semiconductor material may include silicon, germanium, or silicon-germanium. The second substrate 201 may also be provided as, for example, a bulk wafer, an epitaxial layer, a silicon on insulator (SOI) layer, a semiconductor on insulator (SOI) layer, or the like.

The second interlayer insulating layer 220 may be formed of an insulating material, and may include one or more layers. For example, the second interlayer insulating layer 220 may include a silicon oxide and/or a silicon nitride.

The second bonding layer 295 may be a layer for bonding the first substrate structure 100 to the second substrate structure 200. The second bonding layer 295 may be formed of an insulating material, for example, one or more of SiO, SiN, SiCN. SiOC. SiON, or SiOCN.

The circuit gate layers 210 may be gate electrode layers of circuit elements. The circuit gate layers 210 may include a doped semiconductor material and/or a metallic material. Each of the second wiring layers 240 and the second vias 250 may be formed of a conductive material, for example, one or more of tungsten (W), copper (Cu), aluminum (Al), gold (Au), silver (Ag), or an alloy thereof. The number of the second wiring layers 240 and the number and arrangement of the second vias 250 may be varied from those illustrated.

The second connection via CV2 may electrically connect the second substrate structure 200 to the third chip structure 300. The second connection via CV2 may pass through the entirety of the second substrate 201, and may extend into the second interlayer insulating layer 220. The second connection via CV2 may be connected to the second wiring layers 240 disposed within the second interlayer insulating layer 220 on an upper portion of the second connection via CV2. The second connection via CV2 may be connected to the first redistribution layer 260 or the first connection pad 270 on a lower portion of the second connection via CV2. The second connection via CV2 may have a cylindrical shape, and may also have a width narrowing from the upper portion thereof to the lower portion thereof or from the lower portion thereof to the upper portion thereof. The second connection via CV2 may be formed of a conductive material, for example, one or more of tungsten (W), copper (Cu), aluminum (Al), gold (Au), silver (Ag), or an alloy thereof.

The second via insulating layer 272 may be disposed within the second substrate 201 and the second interlayer insulating layer 220 to electrically isolate the second substrate 201 from the second connection via CV2. The second via insulating layer 272 may be formed of an insulating material, for example, a silicon oxide and/or a silicon nitride.

The first redistribution layer 260 and the first connection pad 270 may be a connection structure for bonding the second substrate structure 200 to the third chip structure 300. The first redistribution layer 260 and the first connection pad 270 will be described below in more detail, with reference to FIGS. 4A and 4B. In example embodiments, the first redistribution layer 260 may be omitted. In this case, the second connection via CV2 may be directly connected to the first connection pad 270.

The third chip structure 300 may include a memory chip 310, a dummy chip 320, and an encapsulation portion 350, and may further include second connection pads 330, bumps 340, and a bonding layer 370 disposed within the encapsulation portion 350.

The memory chip 310 may include a memory element, such as a dynamic random access memory (DRAM) element, a static random access memory (SRAM) element, a spin-transfer torque magnetic random-access memory (STT-MRAM) element, or a flash memory element. The memory chip 310 may have an upper surface, which may be an active surface, and may be bonded to the lower surface of the second substrate 201 in a flip-chip bonding manner. However, example embodiments are not limited thereto. The dummy chip 320 may be disposed in parallel with the memory chip 310 in an x direction, to the side of the memory chip 310. When the size of the memory chip 310 is relatively less than that of the second substrate 201, the dummy chip 320 may be disposed within the encapsulation portion 350, which may help with increasing heat dissipation properties and mechanical strength of the image sensing apparatus 10. The number and arrangement of each of the memory chip 310 and the dummy chip 320 may be variously changed in example embodiments. In example embodiments, the dummy chip 320 may be omitted. In this case, only the memory chip 310 may be disposed.

The encapsulation portion 350 may be formed of, for example, a resin material, and may include one or more layers. The encapsulation portion 350 may be formed of, for example, an epoxy resin or a silicone resin. The encapsulation portion 350 may encapsulate the second connection pad 330, the bump 340, and the bonding layer 370. The encapsulation portion 350 may directly contact one or more of the active surface of the memory chip 310 and/or side and/or back surfaces of the die, for example, a semiconductor die, of the memory chip 310. The encapsulation portion 350 may be disposed such that lower surfaces of the memory chip 310 and the dummy chip 320 may be exposed, or the encapsulation portion 350 may cover the lower surfaces of the memory chip 310 and the dummy chip 320.

Each of the second connection pad 330 and the bump 340 may be formed of a conductive material. The bump 340 may have, for example, a cylindrical shape, a spherical shape, or a shape, corresponding to a portion of a spherical shape. The bump 340 may include, for example, Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, or the like.

The bonding layer 370 may bond the dummy chip 320 to the second substrate structure 200. The bonding layer 370 may include, for example, a non-conductive film (NCF) or a non-conductive paste (NCP). In example embodiments, the thickness of the bonding layer 370 may be relatively less than the sum of thicknesses of the second connection pad 330 and the bump 340. In this case, the lower surface of the dummy chip 320 may be covered by the encapsulation portion 350.

In the present example embodiment, the third chip structure 300 may be disposed in a lowermost portion of the image sensing apparatus 10. In another example embodiment, the third chip structure 300 may be disposed between the first substrate structure 100 and the second substrate structure 200. In this case, the first connection via CV1 may be connected to the second substrate structure 200 by passing through the encapsulation portion 350.

Figure 4A:
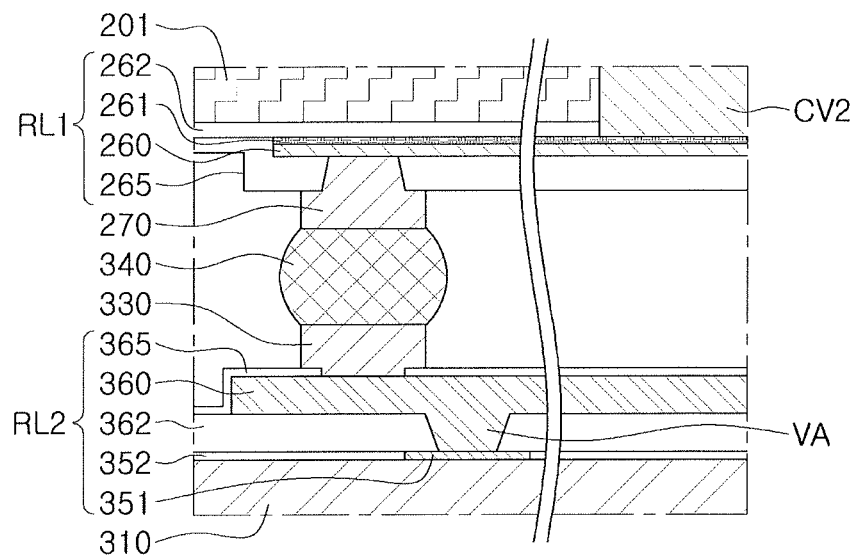
FIGS. 4A and 4B illustrate schematic cross-sectional views of portions of an image sensing apparatus, according to example embodiments.
Figure 4B:
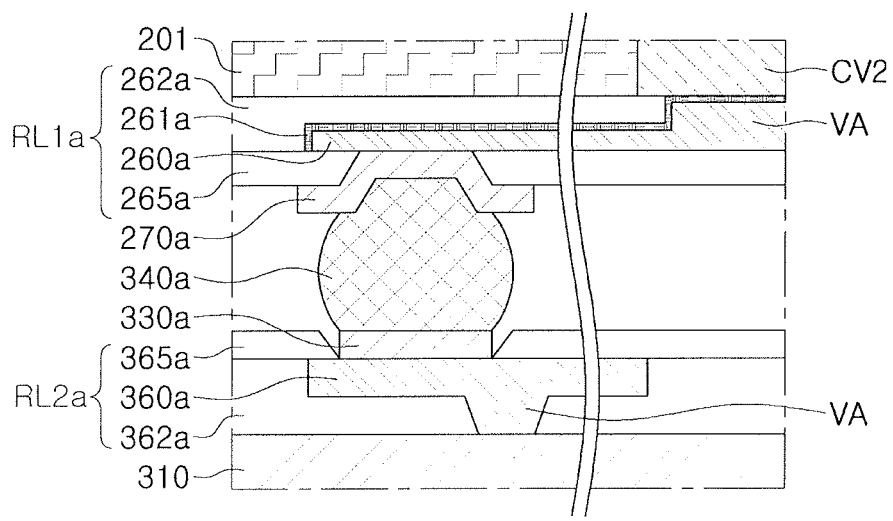

FIGS. 4A and 4B illustrate schematic cross-sectional views of portions of an image sensing apparatus, according to example embodiments. FIGS. 4A and 4B are enlarged views of region A of FIG. 3.

FIG. 4A illustrates a connection portion between the second substrate 201 and the memory chip 310. The second substrate 201 and the memory chip 310 may be connected by a first redistribution portion RL1, the first connection pad 270, the bump 340, the second connection pad 330, and a second redistribution portion RL2.

The first redistribution portion RL1 may include a first redistribution insulating layer 262, a barrier layer 261, the first redistribution layer 260, and a first passivation layer 265 sequentially stacked from the lower surface of the second substrate 201. The second redistribution portion RL2 may include a second redistribution insulating layer 352, a second redistribution layer 351, a third redistribution insulating layer 362, a third redistribution layer 360, and a second passivation layer 365 sequentially stacked from the upper surface of the memory chip 310.

Each of the first, second, and third redistribution insulating layers 262, 352, and 362 may be formed of an insulating material. The first redistribution insulating layer 262 may electrically isolate the first redistribution layer 260, having conductivity, from the second substrate 201. The second redistribution insulating layer 352 may be disposed in a region in which the second redistribution layer 351 is not disposed. The third redistribution insulating layer 362 may be disposed between the second redistribution layer 351 and the third redistribution layer 360.

Each of the barrier layer 261 and the first, second, and third redistribution layers 260, 351, and 360 may be formed of a conductive material, for example, one or more of tungsten (W), copper (Cu), aluminum (Al), gold (Au), silver (Ag), or an alloy thereof. The first redistribution layer 260 may connect the second connection via CV2 to the first connection pad 270. The first redistribution layer 260 may define a position of the first connection pad 270, regardless of that of the second connection via CV2. In an implementation, the barrier layer 261 and the first redistribution layer 260 may be layers formed by a patterning process, and the barrier layer 261 may only be disposed on an upper surface of the first redistribution layer 260. The second redistribution layer 351 may connect the memory chip 310 to the third redistribution layer 360. The third redistribution layer 360 may connect the second redistribution layer 351 to the second connection pad 330, and may have a structure including a via VA. By the second and third redistribution layers 351 and 360, the memory chip 310 may be electrically connected to the second connection pad 330. In the first redistribution portion RL1 and the second redistribution portion RL2, the number of each of the first to third redistribution layers 260, 351, and 360 and the resulting first to third redistribution insulating layers 262, 352, and 362 may be variously changed in example embodiments.

Each of the first and second passivation layers 265 and 365 may be formed of an insulating material, for example, a photosensitive resin.

Each of the first and second connection pads 270 and 330 may include one or more layers. Each of the first and second connection pads 270 and 330 may be formed of a conductive material, for example, one or more of tungsten (W), copper (Cu), tin (Sn), nickel (Ni), aluminum (Al), gold (Au), silver (Ag), or an alloy thereof.

In example embodiments, the second substrate 201 and the memory chip 310 may also be connected only by the first connection pad 270, the bump 340, and the second connection pad 330, without the first and second redistribution portions RL1 and RL2.

Referring to FIG. 4B, the second substrate 201 and the memory chip 310 may be connected by a first redistribution portion RL1a, a first connection pad 270a, a bump 340a, and a second connection pad 330a, and a second redistribution portion RL2a.

The first redistribution portion RL1a may include a first redistribution insulating layer 262a, a barrier layer 261a, a first redistribution layer 260a, and a first passivation layer 265a sequentially stacked from the lower surface of the second substrate 201. The second redistribution portion RL2a may include a third redistribution insulating layer 362a, a third redistribution layer 360a, and a second passivation layer 365a sequentially stacked from the upper surface of the memory chip 310.

In the present example embodiment, the barrier layer 261a and the first redistribution layer 260a may be layers formed by a damascene process, and the barrier layer 261a may be disposed on an upper surface and a side surface of the first redistribution layer 260a. The first redistribution layer 260a may have a structure including a via VA. Further, the first connection pad 270a may have a structure extending from a lower surface of the first passivation layer 265a to the first redistribution layer 260a, and may include an under-bump metallurgy (UBM) layer. Further, the second redistribution portion RL2a may have the second passivation layer 365a disposed around the second connection pad 330a, and may only include the third redistribution layer 360a, a single redistribution layer, relative to the example embodiment of FIG. 4A.

A structure of the connection portion between the second substrate 201 and the memory chip 310, as described above, may be variously changed in example embodiments, and the respective structures, illustrated in FIGS. 4A and 4B, may be selectively combined in example embodiments. For example, in example embodiments, positions of the first redistribution portion RL1 and the second redistribution portion RL2 may be reversed.

Figure 5A:
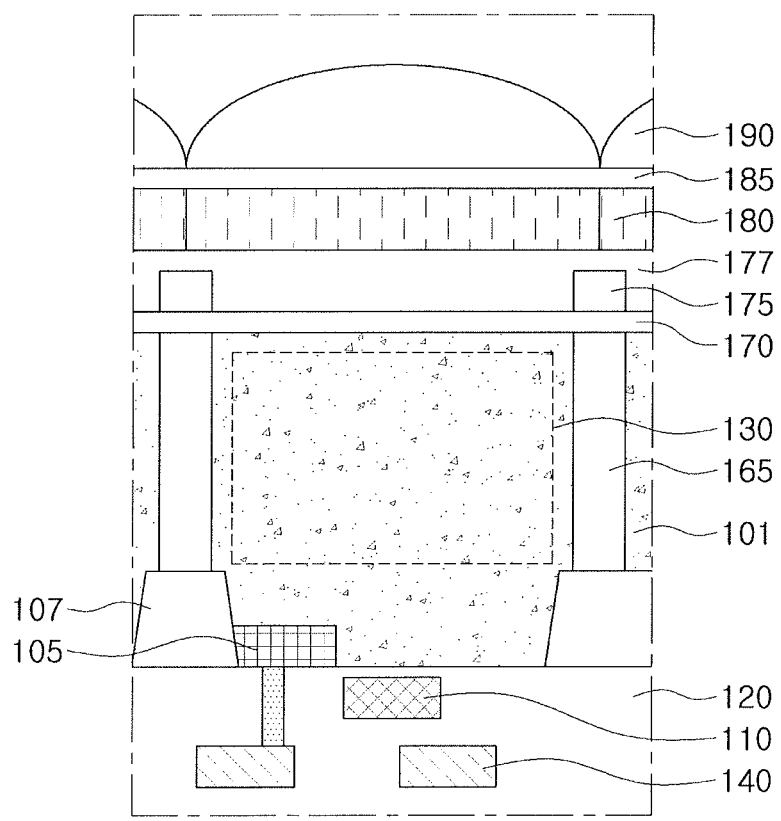
FIGS. 5A and 5B illustrate schematic cross-sectional views of pixels forming a pixel region of an image sensing apparatus, according to example embodiments.
Figure 5B:
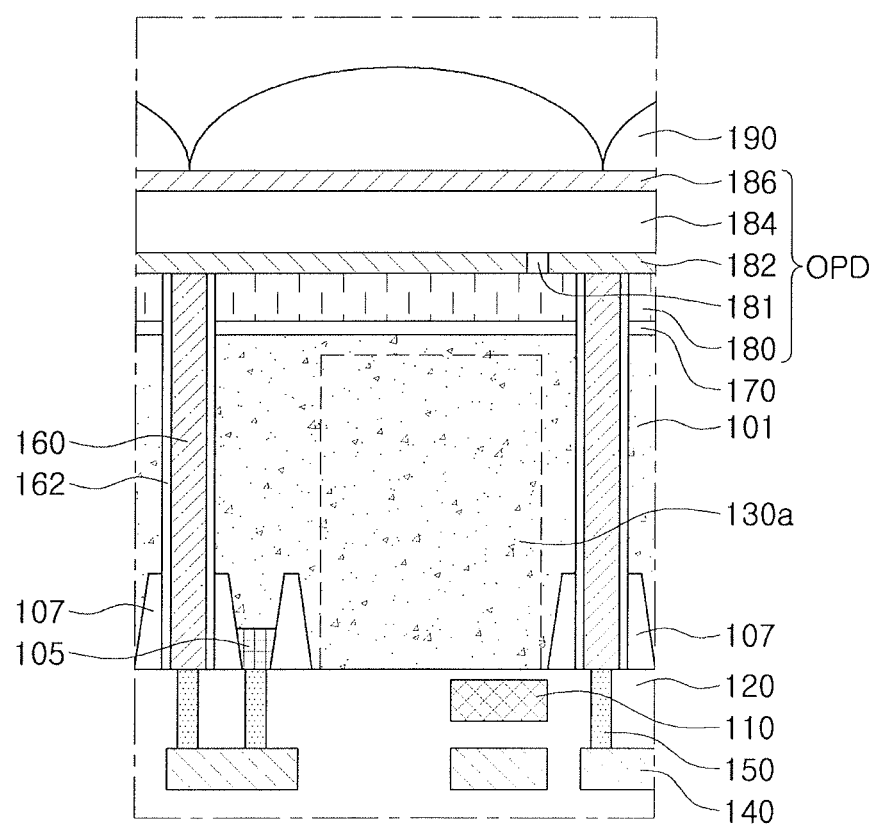

FIGS. 5A and 5B illustrate schematic cross-sectional views of pixels forming a pixel region of an image sensing apparatus, according to example embodiments. FIGS. 5A and 5B are enlarged views of region P of FIG. 3.

Referring to FIG. 5A, a pixel Pa may include the storage node region 105, element isolation regions 107, the photodiode 130, and the pixel isolation regions 165 disposed within the first substrate 101. The pixel Pa may include the pixel gate layer 110, the first wiring layers 140, and the first via 150 disposed within the first interlayer insulating layer 120. The pixel Pa may include the buffer layer 170, the grids 175, the lower planarization layer 177, the color filter 180, the upper planarization layer 185, and the microlens 190 disposed above the first substrate 101.

The storage node region 105 may be disposed within the first substrate 101 to be spaced from the photodiode 130 by the element isolation regions 107. The storage node region 105 may include impurities of a conductivity type different from that of the first substrate 101. The storage node region 105 may be a region corresponding to a floating diffusion FD that will be described below with reference to FIGS. 6A and 6B.

The element isolation regions 107 may extend from one surface of the first substrate 101 into the first substrate 101, and may be a region formed of an insulating material.

The photodiode 130 may be disposed within the first substrate 101, and may absorb incoming light as a photoelectric conversion element to generate and accumulate electric charges corresponding to intensity of the light. The photodiode 130 may include an impurity region.

The pixel isolation regions 165 may be disposed below the boundary of each pixel Pa. The pixel isolation regions 165 may surround the photodiode 130. A relative arrangement relationship between the pixel isolation regions 165 and the photodiode 130 is not limited to that illustrated in the drawings, and may be variously changed in example embodiments. For example, lower surfaces of the pixel isolation regions 165 may be higher or lower than a lower surface of the photodiode 130. The pixel isolation regions 165 may include an insulating material. For example, the pixel isolation regions 165 may include a silicon oxide and/or a silicon nitride.

The pixel gate layer 110 may be disposed between the first wiring layer 140 and the photodiode 130. The pixel gate layer 110 may constitute a gate electrode of a pixel circuit element disposed within the pixel Pa.

The first wiring layers 140 and the first via 150 may be disposed within the first interlayer insulating layer 120 to be electrically connected to the storage node region 105 and the photodiode 130 disposed within the first substrate 101. The first wiring layers 140 may be parallel to one surface of the first substrate 101, and the first via 150 may be perpendicular to the one surface of the first substrate 101, and may have a cylindrical shape or a truncated cone shape. Each of the first wiring layers 140 and the first vias 150 may be formed of a conductive material, for example, one or more of tungsten (W), copper (Cu), aluminum (Al), gold (Au), silver (Ag), or an alloy thereof. The number of the first wiring layers 140 and the number and arrangement of the first vias 150 may be varied from those illustrated in the drawings.

The buffer layer 170 may be disposed on the photodiode 130 and the pixel isolation regions 165. The buffer layer 170 may include an insulating material, for example, one or more of $SiO_2$, SiON, $Al_2O_3$, $HfO_2$, $Ta_2O_5$, and $ZrO_2$, and may include a multilayer film formed of different materials.

In example embodiments, an anti-reflective layer may be further provided below the buffer layer 170. The anti-reflective layer may allow a refractive index of incoming light to be adjusted, such that the light may travel to the photodiode 130 with a high level of transmittance.

The grids 175 may be disposed on the buffer layer 170, and may be disposed below the boundary of each pixel Pa. The grids 175 may be disposed above the pixel isolation regions 165 in a direction perpendicular to one surface of the first substrate 101. The grids 175 may include, for example, a metal such as aluminum (Al), chromium (Cr), molybdenum (Mo), titanium (Ti), or tungsten (W). In example embodiments, the grids 175 may also be disposed within the color filter 180. In this case, the lower planarization layer 177 may be omitted.

The lower planarization layer 177 may be disposed on the buffer layer 170 and the grids 175. The lower planarization layer 177 may completely cover the grids 175, and may have an upper surface higher than that of each of the grids 175. The lower planarization layer 177 may include an insulating material, for example, a silicon oxide.

The color filter 180 may be disposed on the lower planarization layer 177. The color filter 180 may be disposed above the photodiode 130. The color filter 180 may pass light having a certain wavelength, such that the filtered light may reach the photodiode 130 disposed therebelow. The color filters 180 may be implemented as a color filter array including, for example, a red (R) filter, a green (G) filter, and a blue (B) filter. The color filter 180 may be formed of, for example, a mixture of a resin, and coloring agent such as a pigment including a metal or a metal oxide.

The upper planarization layer 185 may be disposed on the color filter 180. The upper planarization layer 185 may include an insulating material, for example, a silicon oxide.

The microlens 190 may redirect a path of light received to a region to concentrate the light on the photodiode 130. The microlens 190 may be formed of a transparent material, for example, a TMR-based resin (Tokyo Ohka Kogyo Co., Ltd.) or an MFR-based resin (JSR Corporation).

Referring to FIG. 5B, a pixel Pb may have a structure including an organic photodiode OPD, in addition to a photodiode 130a, relative to the example embodiment of FIG. 5A. For example, the pixel Pb may include the storage node region 105, the element isolation regions 107, the photodiode 130a, and pixel vias 160 disposed within the first substrate 101. The pixel Pb may further include the pixel gate layer 110, the first wiring layers 140, and the first via 150 disposed within the first interlayer insulating layer 120. The pixel Pb may include the buffer layer 170, the organic photodiode OPD, the color filter 180, and the microlens 190 disposed on the first substrate 101. Hereinafter, features of the pixel Pb, different from those of the pixel Pa of FIG. 5A, will be described.

The photodiode 130a may be formed of a semiconductor material, as in the example embodiment of FIG. 5A. The photodiode 130a, according to the example embodiment, may have a lower surface coplanar with that of the first substrate 101. The photodiode 130a may include, for example, two impurity regions having different conductivity types.

The pixel vias 160 may be electrically isolated from the first substrate 101 and the photodiode 130a by pixel via insulating layers 162. The pixel vias 160 may be formed of a conductive material, and may connect the organic photodiode OPD to the first via 150. In example embodiments, the pixel vias 160 may also include two or more layers stacked in a vertical direction.

The organic photodiode OPD may be disposed above the photodiode 130a, and may receive light having a color different from that of light received to the photodiode 130a, to generate electric charges. The organic photodiode OPD may include first and second electrode layers 182 and 186 facing each other, and an electrode insulating layer 181 disposed between portions of the first electrode layer 182, which may be connected to the pixel vias 160. A color selection layer 184 may be disposed between the first and second electrode layers 182 and 186 to generate electric charges using a photoelectric effect. The color selection layer 184 may include an organic material, and may include a p-type layer in which a main carrier is a hole, and an n-type layer in which a main carrier is an electron. The color selection layer 184 may generate electric charges, in response to light having a specific wavelength band, and as an example, may generate electric charges, in response to light having a green color. In this case, light having different colors, except for the green color, may be transferred to the photodiode 130a through the color filter 180.

Each of the first and second electrode layers 182 and 186 may be formed of a transparent conductive material, such as ITO, IZO, ZnO, or $SnO_2$, or a semitransparent conductive material, such as a metal thin film, or the like. In example embodiments, the second electrode layer 186 may be formed of a material having a work function greater than or equal to that of the first electrode layer 182.

The respective pixels Pa and Pb of FIGS. 5A and 5B may include photoelectric conversion elements, such as one or more photodiodes 130, and may include a pixel circuit processing electric charges generated by the photoelectric conversion element. Such a pixel circuit will be described below, with reference to FIGS. 6A and 6B.

Figure 6A:
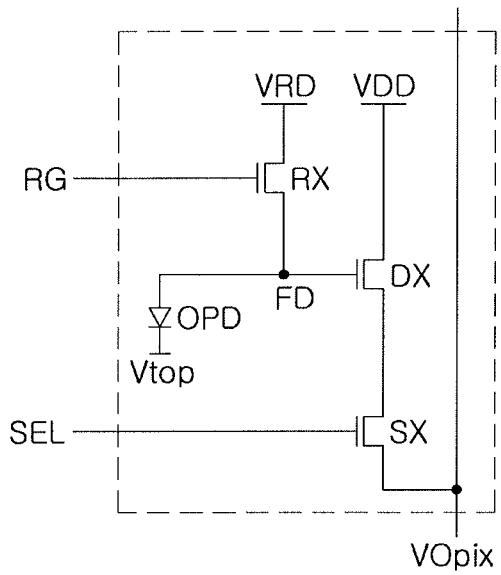
FIGS. 6A and 6B illustrate circuit diagrams of pixel circuits of an image sensing apparatus, according to example embodiments.
Figure 6B:
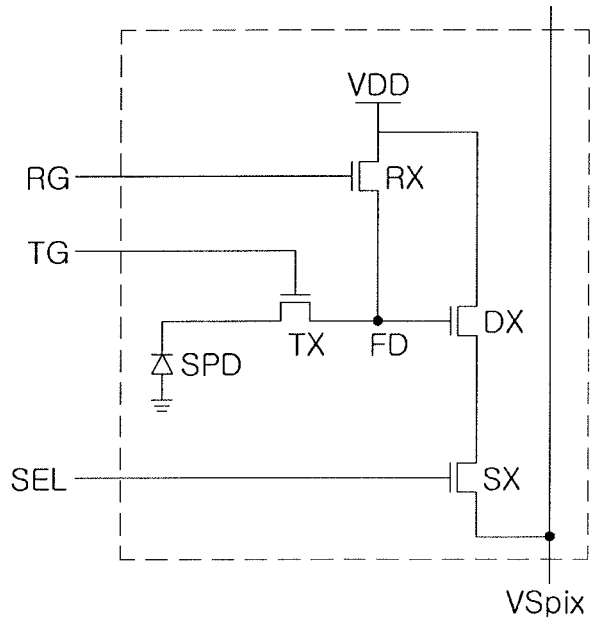

FIGS. 6A and 6B illustrate circuit diagrams of pixel circuits of an image sensing apparatus, according to example embodiments.

Referring to FIG. 6A, the pixel circuit may be a circuit generating an electrical signal, using electric charges generated by an organic photodiode (OPD).

The pixel circuit may include, for example, a plurality of transistors RX, DX, and SX, and may have a three transistor (3T) circuit structure. The pixel circuit may include a reset transistor RX, a drive transistor DX, and a select transistor SX. A gate terminal of the drive transistor DX may be connected to a floating diffusion FD, and electric charges generated by the organic photodiode OPD may be accumulated in the floating diffusion FD. The organic photodiode OPD may include first and second electrodes parallel to each other, and an organic photoconversion layer therebetween. The organic photoconversion layer may receive light having a predetermined wavelength band to generate electric charges.

The drive transistor DX may operate as a source follower buffer amplifier by electric charges accumulated in the floating diffusion FD. The drive transistor DX may amplify electric charges accumulated in the floating diffusion FD and transfer the amplified electric charges to the select transistor SX.

The select transistor SX may be operated, in response to a select control signal SEL input, by a row driver, and may perform switching and addressing operations. For example, when the select control signal SEL is applied from the row driver, a first pixel signal VOpix may be output to a first column line connected to the select transistor SX. The first pixel signal VOpix may be detected by a column driver and a readout circuit.

The reset transistor RX may be operated, in response to a reset control signal RG input by the row driver. The reset transistor RX may reset a voltage of the floating diffusion FD to a readout voltage VRD, in response to the reset control signal RG.

In the present example embodiment, the organic photodiode OPD may use holes as main charge carriers. For example, when the hole is used as the main charge carrier, a cathode of the organic photodiode OPD may be connected to the floating diffusion FD, and an anode of the organic photodiode OPD may be connected to an upper electrode voltage Vtop. The upper electrode voltage Vtop may have a voltage of a few volts, for example, about 3.0 V. Since the hole is generated as the main charge carrier in the organic photodiode OPD, a drain terminal of the reset transistor RX may be connected to the readout voltage VRD having a voltage level different from that of a power supply voltage VDD. Dark current characteristics may be improved by implementing the pixel circuit such that the pixel circuit may use the hole as the main charge carrier. In example embodiments, the organic photodiode OPD may also generate electrons as main charge carriers, and may have a resulting circuit structure.

Referring to FIG. 6B, the pixel circuit may be a circuit generating an electrical signal, using electric charges generated by a semiconductor photodiode SPD.

The pixel circuit may be, for example, a 4T circuit including four transistors. The pixel circuit may further include a transfer transistor TX, in addition to a reset transistor RX, a drive transistor DX, a select transistor SX. The semiconductor photodiode SPD, connected to the pixel circuit, may be a semiconductor photodiode formed on a semiconductor substrate including silicon or the like, and may be connected to a floating diffusion FD through the transfer transistor TX. For example, relative to the example embodiment described above with reference to FIG. 6A, a cathode or an anode of the semiconductor photodiode SPD may not be directly connected to the floating diffusion FD.

The transfer transistor TX may transfer electric charges, accumulated in the semiconductor photodiode SPD, to the floating diffusion FD, based on a transfer control signal TG transmitted by a row driver. The semiconductor photodiode SPD may generate electrons as main charge carriers. Operations of the reset transistor RX, the drive transistor DX, and the select transistor SX may be similar to those described above with reference to FIG. 6A, and a second pixel signal VSpix may be output through a second column line connected to the select transistor SX. The second pixel signal VSpix may be detected by a column driver and a readout circuit.

Figure 7A:
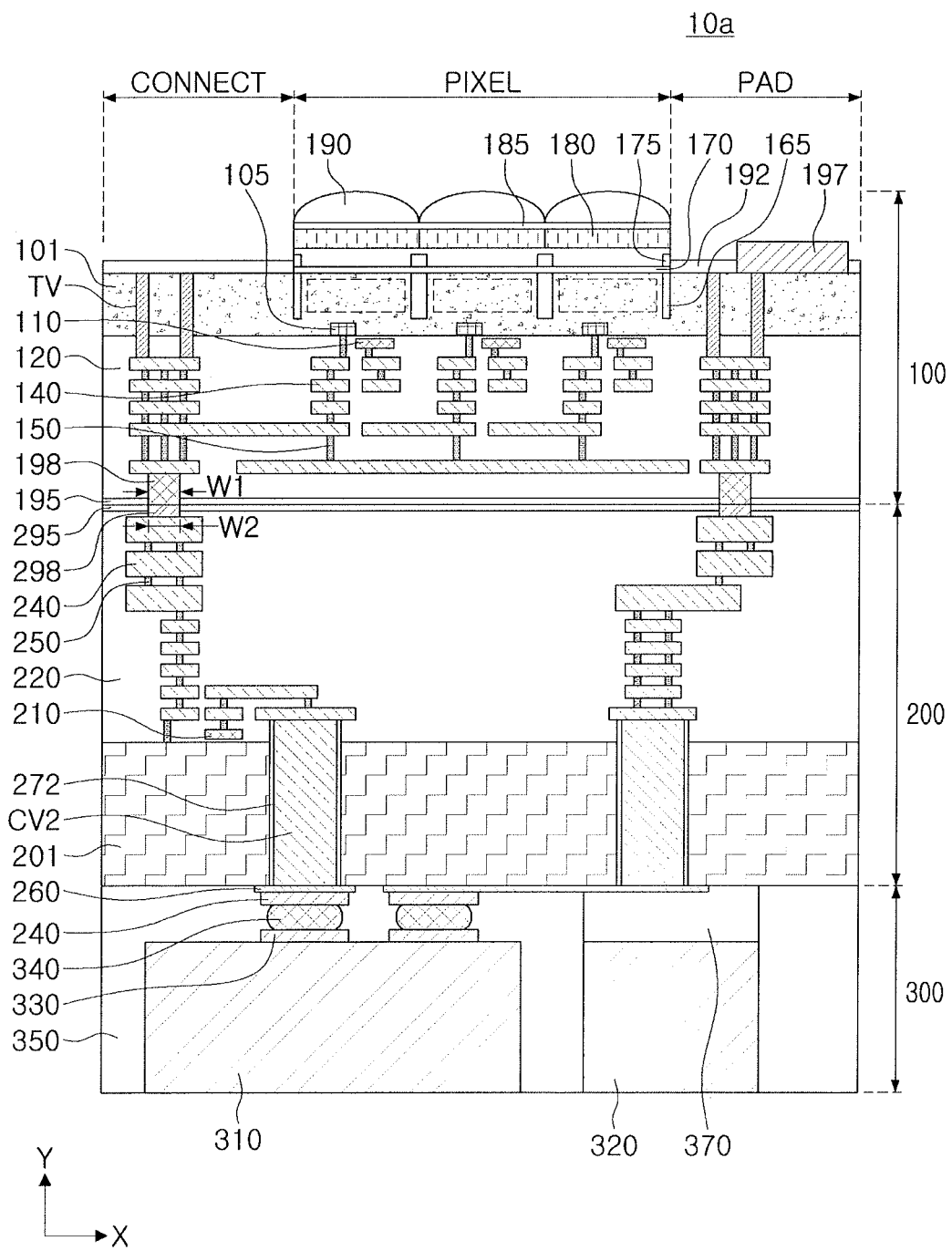
FIGS. 7A and 7B illustrate schematic cross-sectional views of image sensing apparatuses, according to example embodiments.
Figure 7B:
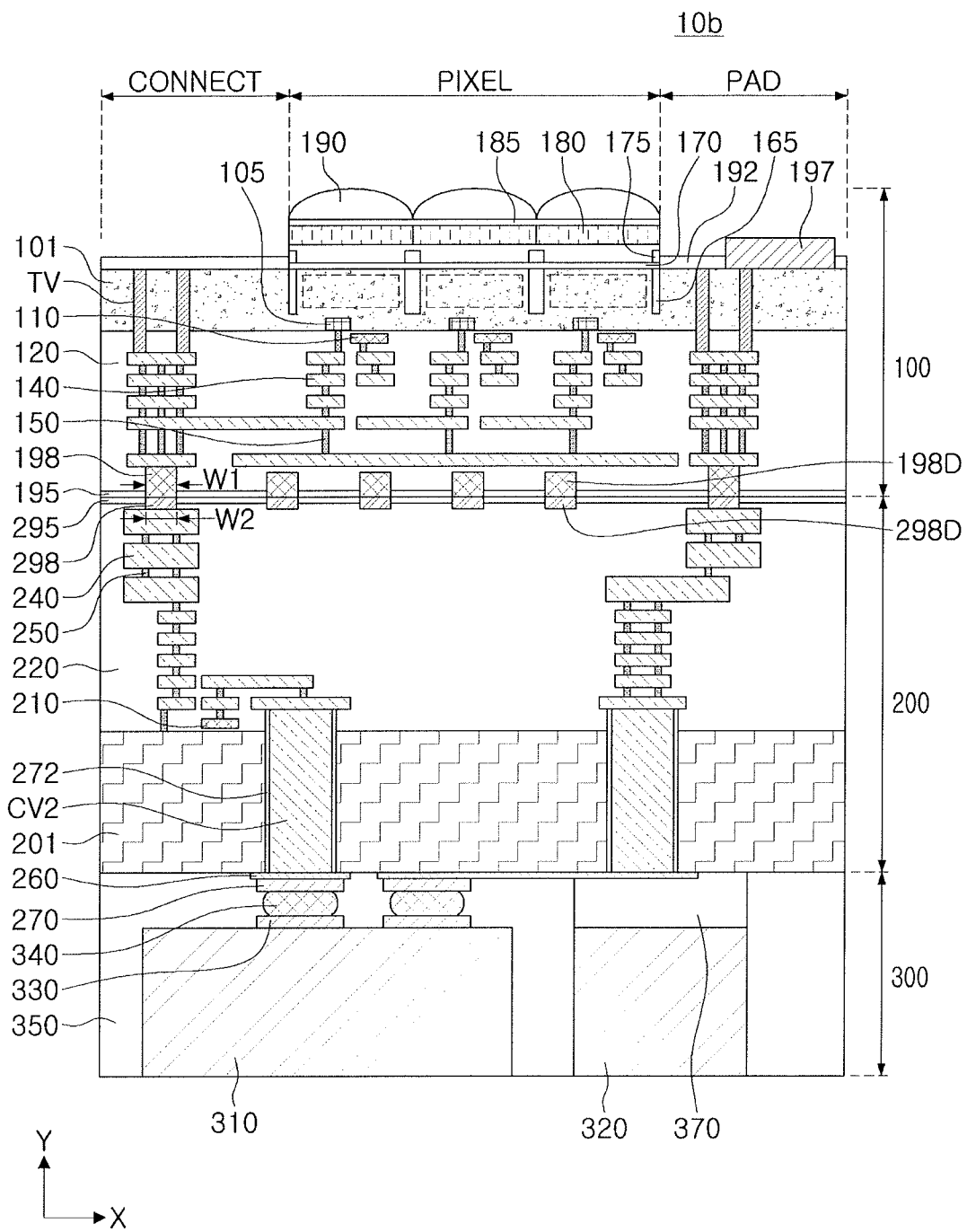

FIGS. 7A and 7B illustrate schematic cross-sectional views of image sensing apparatuses, according to example embodiments.

Referring to FIG. 7A, an image sensing apparatus 10a may not include the first connection via CV1, relative to the example embodiment of FIG. 3. The image sensing apparatus 10a may include first connection portions 198 disposed in lower portions of a first interlayer insulating layer 120, and second connection portions 298 disposed in upper portions of a second interlayer insulating layer 220, to electrically connect a first substrate structure 100 to a second substrate structure 200. The first connection portions 198 may be connected to first wiring layers 140, and the second connection portions 298 may be connected to second wiring layers 240. The first and second connection portions 198 and 298 may pass through first and second bonding layers 195 and 295, respectively.

Each of the first and second connection portions 198 and 298 may have a columnar shape. Each of the first and second connection portions 198 and 298 may be formed of a conductive material, and for example, may be a metal layer formed of a metal material. For example, each of the first and second connection portions 198 and 298 may be formed of copper (Cu). A width W1 of each of the first connection portions 198 and a width W2 of each of the second connection portion 298 may be the same, or one of the widths W1 and W2 may be greater than the other, and the widths W1 and W2 and thicknesses of the first and second connection portions 198 and 298 are not limited to those illustrated in FIG. 7A.

Substrate vias TV may be disposed in a pad region PAD and a connection region CONNECT, and the substrate vias TV may be connected to the first wiring layers 140 and first vias 150 disposed within the first interlayer insulating layer 120 through the first substrate 101. As illustrated in FIG. 7A, a plurality of substrate vias TV may be arranged in a single group. However, example embodiments are not limited thereto. The substrate vias TV may be formed of a conductive material, and an insulating layer may further be disposed on a side surface thereof.

Referring to FIG. 7B, an image sensing apparatus 10b may further include first and second dummy connection portions 198D and 298D, in addition to first and second connection portions 198 and 298, relative to the example embodiment of FIG. 7A.

The first dummy connection portions 198D may be disposed in upper portions of a first interlayer insulating layer 120, the second dummy connection portions 298D may be disposed in upper portions of a second interlayer insulating layer 220, and the first and second dummy connection portions 198D and 298D may be formed of the same materials as those of the first and second connection portions 198 and 298. The first and second dummy connection portions 198D and 298D may not be electrically connected to first and second wiring layers 140 and 240. For example, each of the first and second dummy connection portions 198D and 298D may be in a floating state. To this end, the first and second dummy connection portions 198D and 298D may have thicknesses less than those of the first and second dummy connection portions 198D and 298D, respectively. However, example embodiments are not limited thereto. For example, when the first and second dummy connection portions 198D and 298D are disposed in regions in which the lowermost first wiring layers 140 and the uppermost second wiring layers 240 are not disposed, the first and second dummy connection portions 198D and 298D may have the same shapes as those of the first and second dummy connection portions 198D and 298D.

Figure 8:
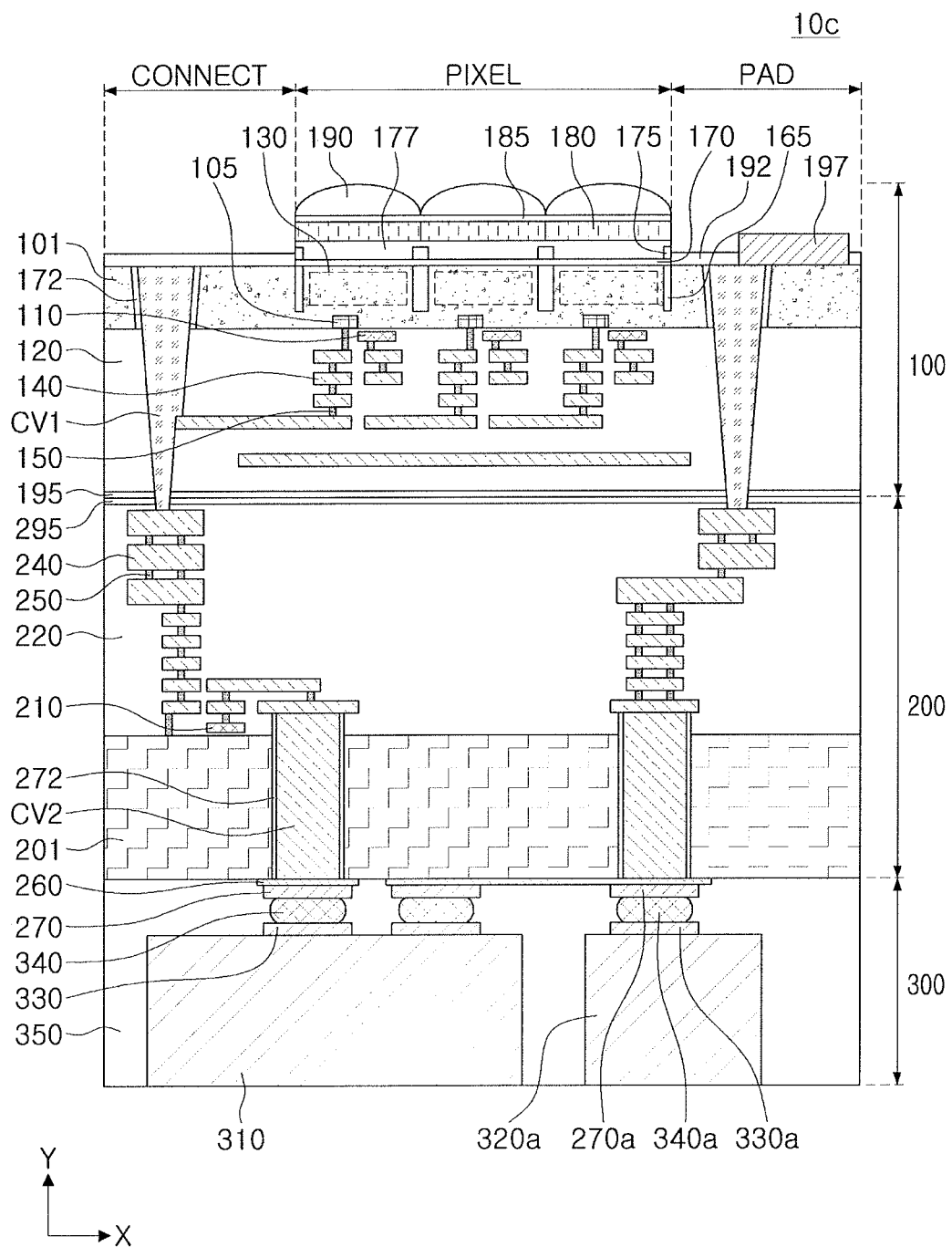
FIG. 8 illustrates a schematic cross-sectional view of an image sensing apparatus, according to example embodiments.

FIG. 8 illustrates a schematic cross-sectional view of an image sensing apparatus, according to example embodiments.

Referring to FIG. 8, an image sensing apparatus 10c may include a third chip structure 300 that may have a logic chip 320a in addition to a memory chip 310, relative to the example embodiment of FIG. 3. The logic chip 320a may have an upper surface, which may be an active surface, and may be bonded to a lower surface of a second substrate 201 in a flip-chip bonding manner. The logic chip 320a may be disposed in parallel with the memory chip 310, and may have a side surface and an upper surface covered by the encapsulation portion 350.

The logic chip 320a may be, for example, a microprocessor chip, and may include, for example, a central processing unit (CPU), a controller, or an application-specific integrated circuit (ASIC) chip. The logic chip 320a may receive image data from a second substrate structure 200 and process the image data. The logic chip 320a may be electrically connected to the second substrate structure 200 through a second connection pad 330a and through a bump 340a. In example embodiments, the logic chip 320a may be directly connected to the memory chip 310 through a redistribution structure.

In example embodiments, the image sensing apparatus 10c may also include all of the logic chip 320a, and the dummy chip 320 according to the example embodiment of FIG. 3.

Figure 9:
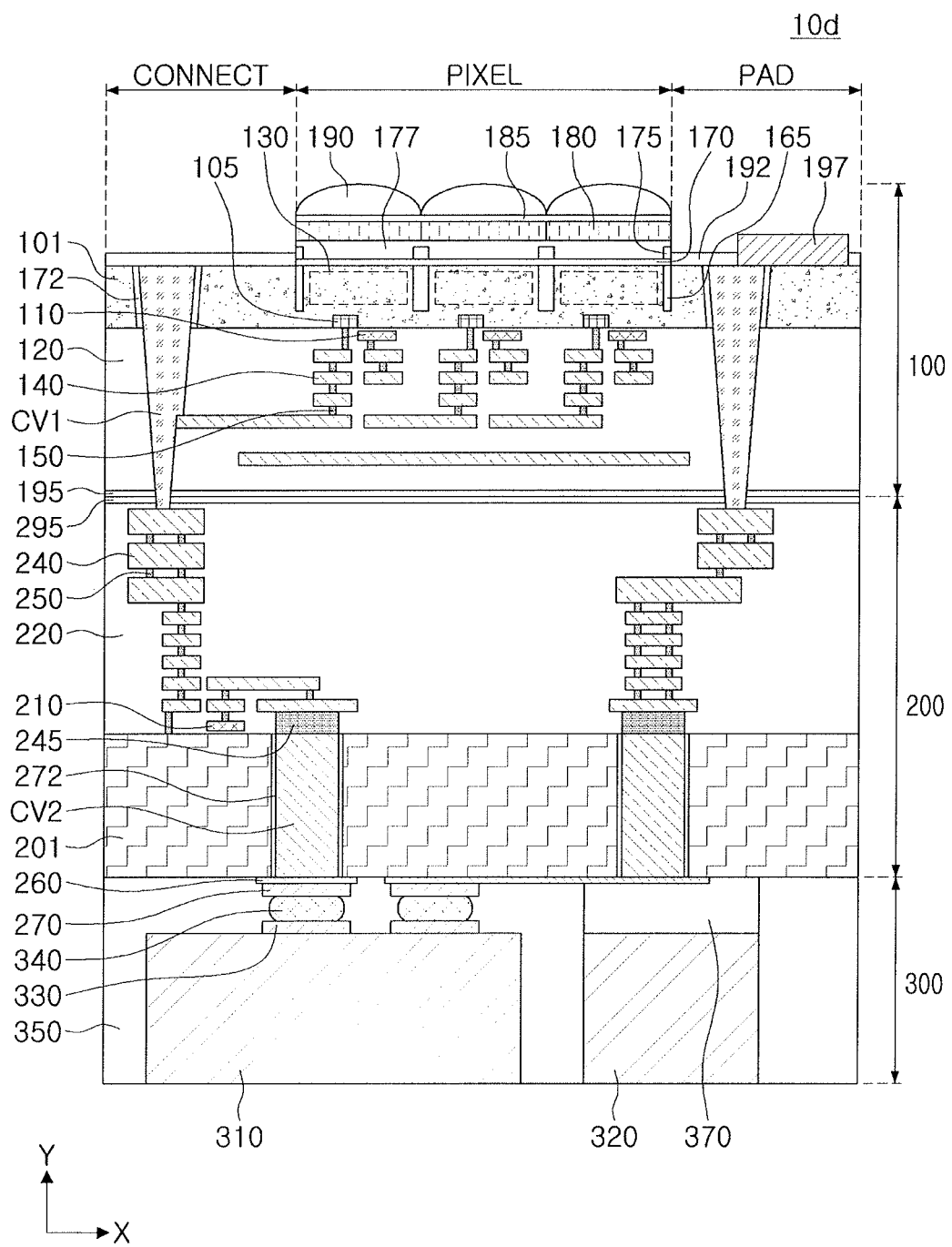
FIG. 9 illustrates a schematic cross-sectional view of an image sensing apparatus, according to example embodiments.

FIG. 9 illustrates a schematic cross-sectional view of an image sensing apparatus, according to example embodiments.

Referring to FIG. 9, an image sensing apparatus 10d may have second connection vias CV2 only extending to an upper surface of a second substrate 201, relative to the example embodiment of FIG. 3. In this case, the second connection vias CV2 may be connected to second wiring layers 240 through separate connection vias 245. A structure of the second connection vias CV2, as described above, may be formed by a process of forming the second connection vias CV2. For example, the second connection vias CV2 may be formed by a via-first process of forming a via prior to formation of circuit elements or by a via-last process of forming a via subsequent to formation of a wiring structure. An example embodiment of the process of forming the second connection vias CV2 will be described below in more detail, with reference to FIGS. 13A through 13C.

The connection vias 245 may be formed of a conductive material, and may have a size similar to that of the second connection vias CV2. In example embodiments, the shape of the connection vias 245 may be variously modified. For example, the connection vias 245 may also have a structure including a plurality of second vias 250.

Figure 10A:
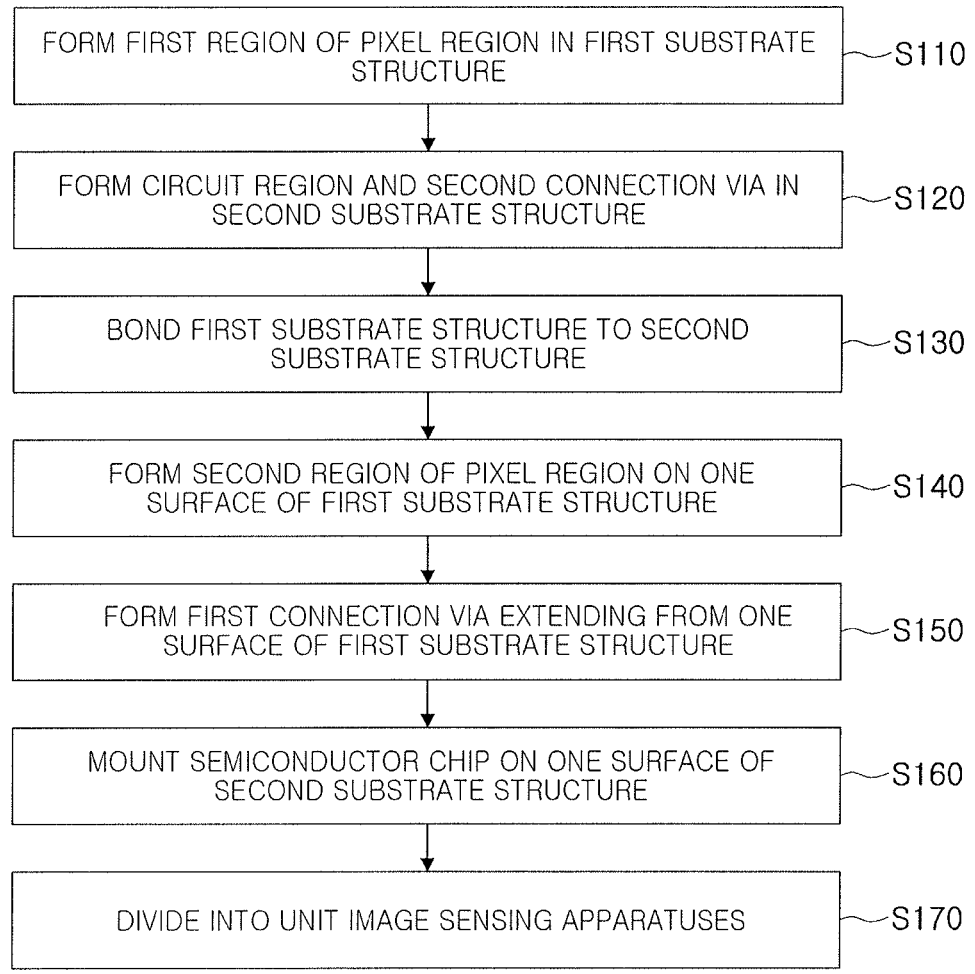
FIGS. 10A and 10B illustrate schematic flowcharts of a method of manufacturing an image sensing apparatus, according to example embodiments.
Figure 10B:
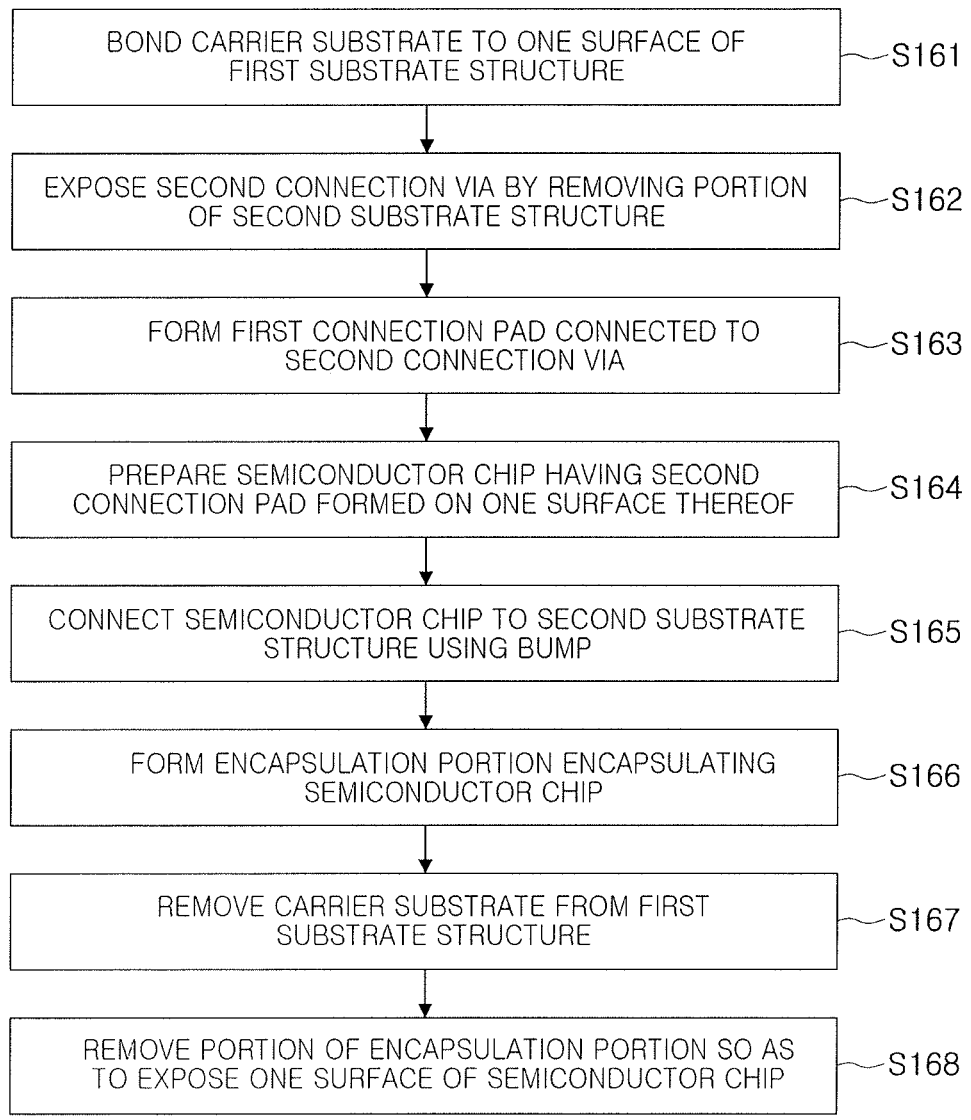
Figure 11A:
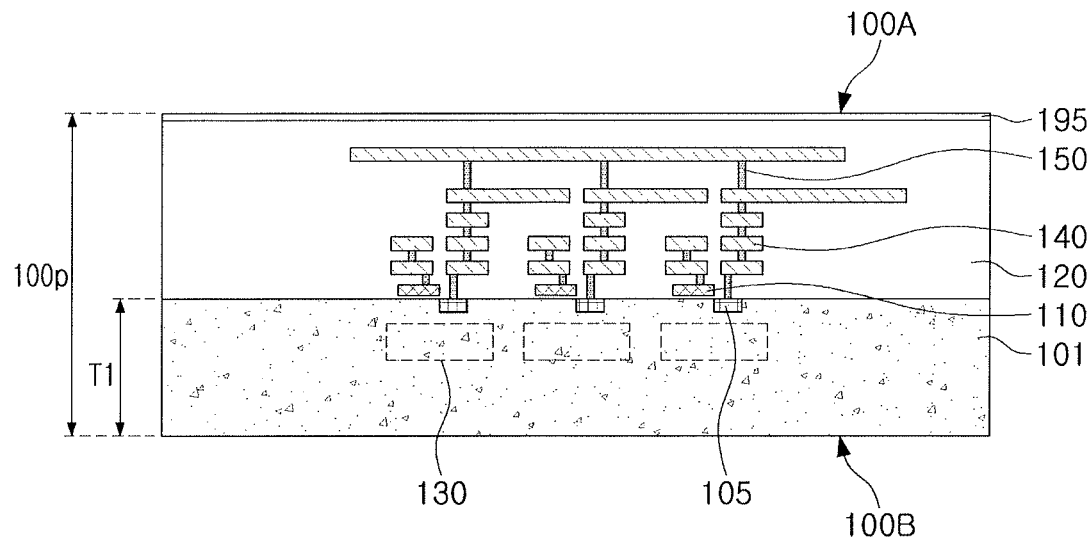
FIGS. 11A to 11L illustrate schematic cross-sectional views of a method of manufacturing an image sensing apparatus, according to example embodiments.
Figure 11B:
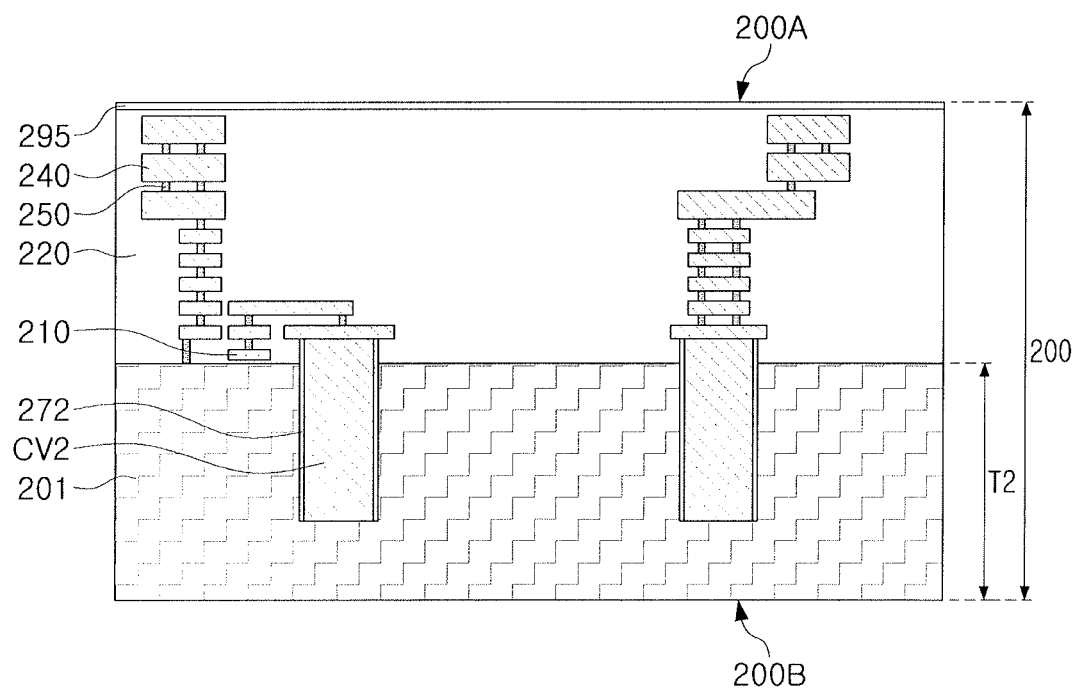

FIGS. 10A and 10B illustrate schematic flowcharts of a method of manufacturing an image sensing apparatus, according to an example embodiment, and FIGS. 11A and 11B illustrate schematic cross-sectional views of a method of manufacturing an image sensing apparatus, according to an example embodiment.

Referring to FIGS. 10A and 11A, a first region of a pixel region may be formed on a first substrate structure 100p (S110). In the process, components disposed in a first substrate 101 and those disposed in a first interlayer insulating layer 120 may be formed in the pixel region PIXEL of FIG. 3.

The first substrate 101 may have a first thickness T1, which may be greater than an ultimate thickness of the first substrate 101 of FIG. 3. The components, disposed within the first substrate 101 while including storage node regions 105 and photodiodes 130, may be formed. The storage node regions 105 and the photodiodes 130 may be formed by injecting impurities into the first substrate 101 through an ion implantation process. For example, the storage node regions 105 may be formed by injecting n-type impurities into the first substrate 101, and each of the photodiodes 130 may include an n-type impurity region and a p-type impurity region.

Subsequently, pixel gate layers 110, first wiring layers 140, and first vias 150 may be formed on the first substrate 101 to constitute a pixel circuit. Subsequent to the formation of the pixel gate layers 110, at least a portion of the first interlayer insulating layer 120 may be formed on an upper surface of the first substrate 101. The first interlayer insulating layer 120 may be formed in part in the process of forming the first wiring layers 140 and the first vias 150, to ultimately cover the components disposed on the first substrate 101. A first bonding layer 195 may be formed on an upper surface of the first interlayer insulating layer 120.

In the process, the first substrate structure 100p, including the first substrate 101 and the first interlayer insulating layer 120, in which the first region, a portion of the pixel region, is formed, may have a first surface 100A and a second surface 100B.

Referring to FIGS. 10A and 11B, a circuit region and second connection vias CV2 may be formed in a second substrate structure 200 (S120).

The second substrate 201 may have a second thickness T2, which may be greater than an ultimate thickness of the second substrate 201 of FIG. 3. Regions for circuit configuration, such as an element isolation region and an impurity region, may be formed in the second substrate 201, and then circuit gate layers 210 may be formed on the second substrate 201.

Subsequently, a portion of a second interlayer insulating layer 220 may be formed to cover the circuit gate layers 210. The second interlayer insulating layer 220 and the second substrate 201 may be etched to certain depths from upper surfaces thereof to form holes, and the holes may be sequentially filled with an insulating material and a conductive material, so that second via insulating layers 272 and the second connection vias CV2 may be formed. In the present example embodiment, the second connection vias CV2 may be formed by a via-middle process of forming a via prior to formation of a wiring after circuit elements are formed.

At least a portion of the second interlayer insulating layer 220 may be formed on the second substrate 201, and second wiring layers 240 and second vias 250 may be formed thereon. The second interlayer insulating layer 220 may be formed to cover all of the circuit gate layers 210, the second wiring layers 240, and the second vias 250. A second bonding layer 295 may be formed on an upper surface of the second interlayer insulating layer 220.

In the process, the second substrate structure 200, including the second substrate 201 and the second interlayer insulating layer 220, in which a circuit for driving pixels is formed, may have a first surface 200A and a second surface 200B.

Figure 11C:
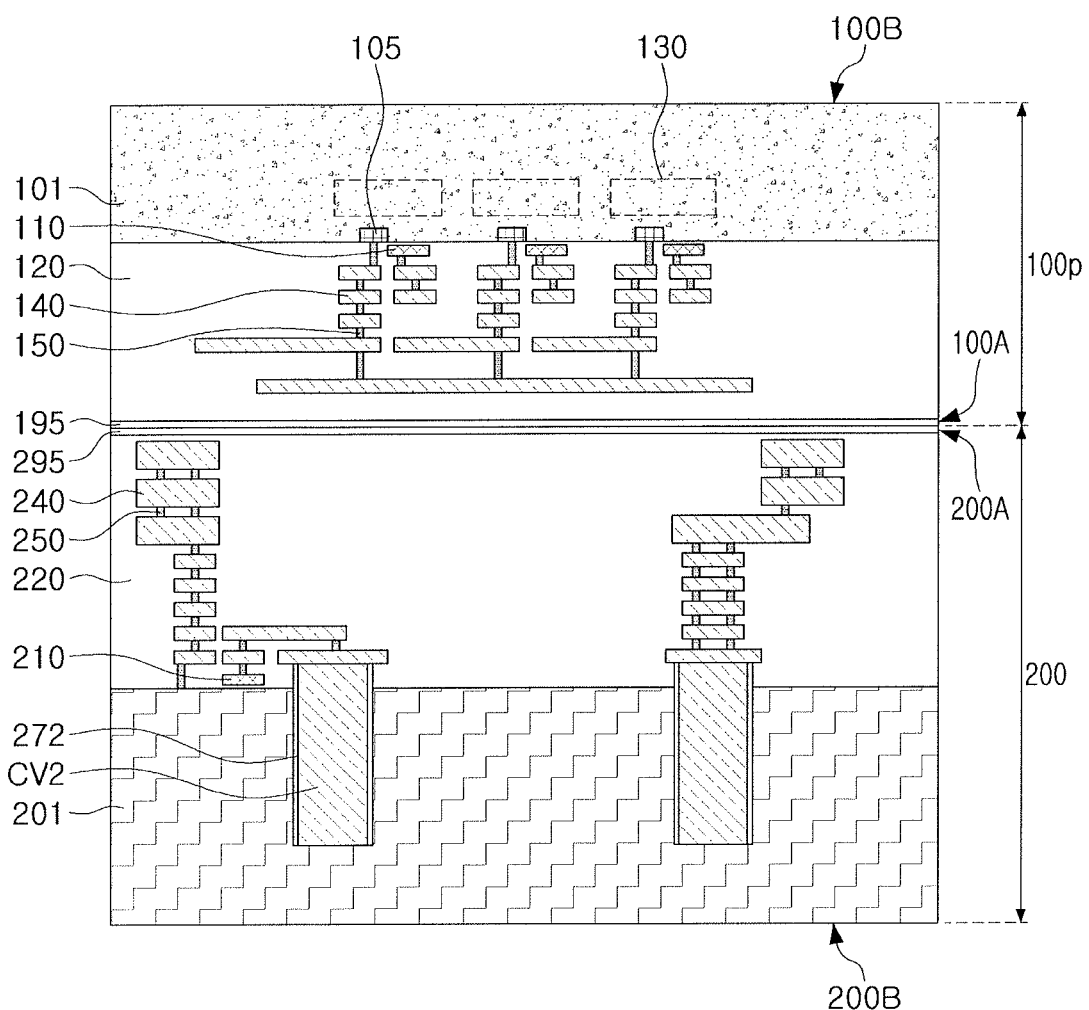

Referring to FIGS. 10A and 11C, the first substrate structure 100p may be bonded to the second substrate structure 200 (S130).

For example, the first substrate structure 100p and the second substrate structure 200 may be bonded by bonding the first surface 100A of the first substrate structure 100p to the first surface 200A of the second substrate structure 200. The first bonding layer 195 of the first substrate structure 100p and the second bonding layer 295 of the second substrate structure 200 may be bonded to each other. For example, when the first and second bonding layers 195 and 295 are formed of the same materials, the first and second bonding layers 195 and 295 may be bonded by pressure without a separate bonding layer.

The image sensing apparatuses 10a and 10b, described above with reference to FIGS. 7A and 7B, may be fabricated by forming the first and second connection portions 198 and 298, such that the first and second connection portions 198 and 298 may pass through the first and second bonding layers 195 and 295, respectively, in the previous processes described above with reference to FIGS. 11A and 11B, and then bonding the first and second bonding layers 195 and 295, such that the first and second connection portions 198 and 298 may be connected to each other.

Figure 11D:
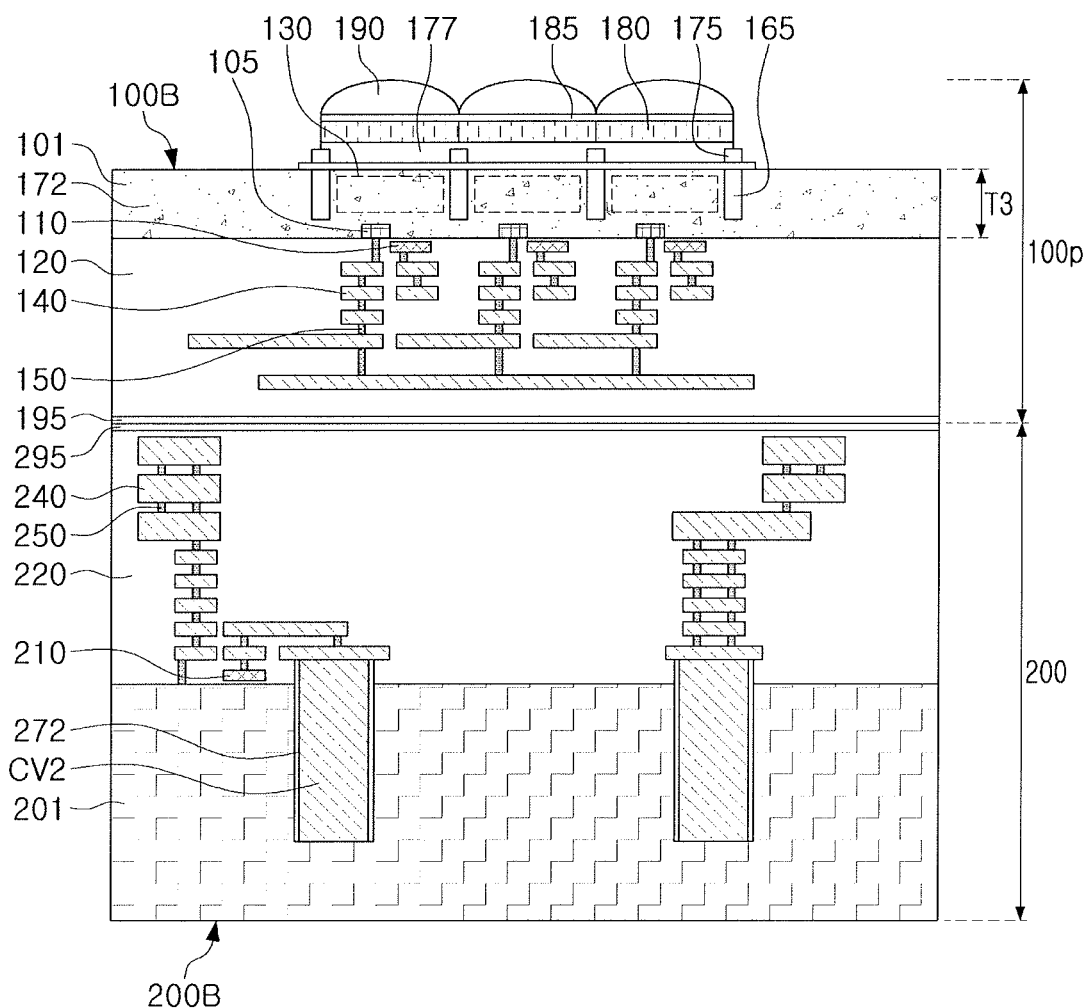

Referring to FIGS. 10A and 11D, a second region of the pixel region may be formed on one surface of the first substrate structure 100p (S140). In the process, components, disposed on the first substrate 101, may mainly be formed in the pixel region PIXEL of FIG. 3.

First, a process of thinning the first substrate 101 may be performed. Material of the first substrate 101 may be removed from the second surface 100B of the first substrate structure 100p by a predetermined thickness, to have a third thickness T3 less than the first thickness T1 of FIG. 11A. A portion of the first substrate 101 may be removed by a polishing process or a back-grinding process.

Pixel isolation regions 165 may be formed to have a predetermined depth from an upper surface of the first substrate 101 of which the portion has been removed. Subsequently, a buffer layer 170 may be formed on the upper surface of the first substrate 101, and grids 175 may be formed in regions including boundaries of the pixels. A lower planarization layer 177 may be formed to cover the grids 175. Color filters 180 may be formed as, for example, red (R), green (G), and blue (B) filters, in the respective pixels. An upper planarization layer 185 may be formed on the color filters 180, and microlenses 190 may be formed on the upper planarization layer 185.

Figure 11E:
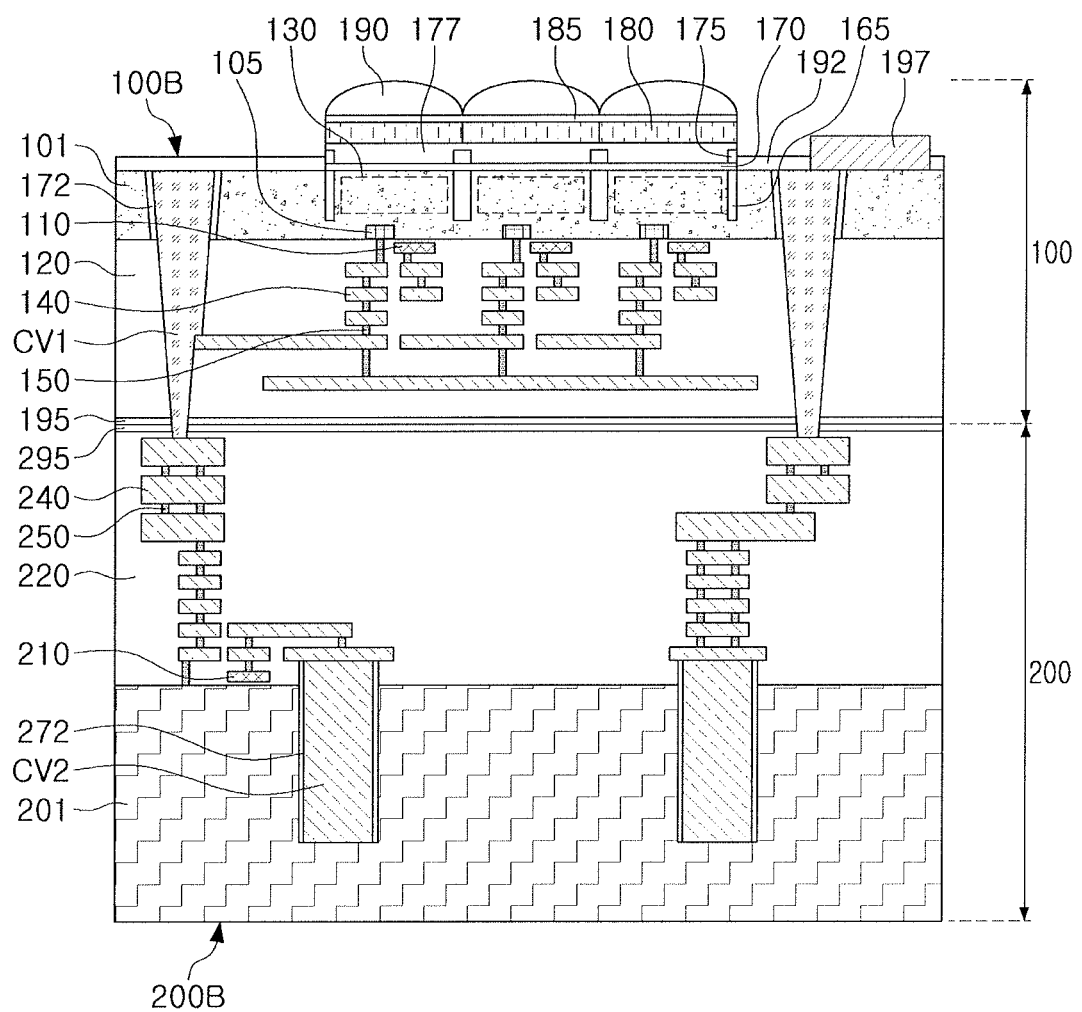

Referring to FIGS. 10A and 11E, first connection vias CV1 may be formed to extend from one surface of the first substrate structure 100p (S150).

The first connection vias CV1 may pass through the first substrate 101 and the first interlayer insulating layer 120, and may extend into the second interlayer insulating layer 220, from the upper surface of the first substrate 101. The first connection vias CV1 may be connected to the uppermost second wiring layers 240 in the second interlayer insulating layer 220. In example embodiments, extension lengths of the first connection vias CV1 may be different. For example, the first connection vias CV1, formed in the connection region CONNECT of FIG. 3, may extend to at least one first wiring layer 140 disposed within the first interlayer insulating layer 120, and the first connection vias CV1, formed in the pad region PAD, may extend into the second interlayer insulating layer 220.

Holes may be formed to extend from the upper surface of the first substrate 101, and a conductive material may be deposited in the holes to form the first connection vias CV1. First via insulating layers 172 may be formed on side surfaces of the first connection vias CV1 in the first substrate 101.

Subsequently, an upper insulating layer 192 may be formed to cover the upper surface of the first substrate 101, and a pad layer 197 may be formed in the pad region PAD of FIG. 3 to connect to the first connection via CV1.

By the process, the first substrate structure 100, including the first substrate 101, may be completed. In example embodiments, a test process for an image sensing unit, including the first and second substrate structures 100 and 200, for example, an image sensor, may further be performed.

Referring to FIG. 10A, a process of mounting a semiconductor chip on one surface of the second substrate structure 200 may be performed (S160). Operations for the process are illustrated in FIG. 10B.

Figure 11F:
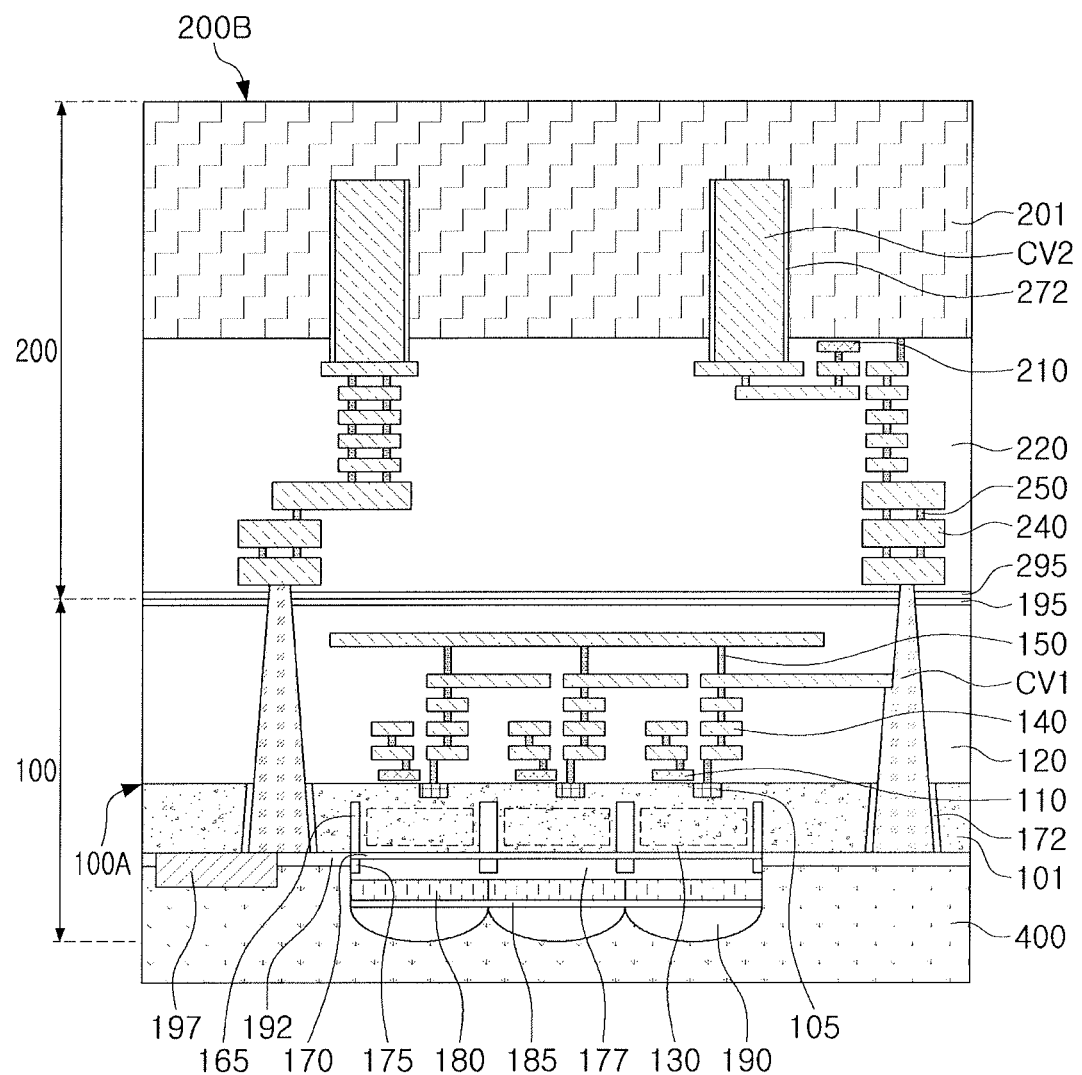

Referring to FIGS. 10B and 11F, a carrier substrate 400 may be bonded to one surface of the first substrate structure 100 (S161).

The carrier substrate 400 may be bonded to support a stack structure of the first and second substrate structures 100 and 200 in a subsequent process. The carrier substrate 400 may be bonded to the second surface 100E of the first substrate structure 100, for example, using a bonding layer. The bonding layer may be formed of a material enabling the carrier substrate 400 to be attached thereto or detached therefrom in a subsequent process, and a film-type or liquid-type material may be used. The carrier substrate 400 may include, for example, silicon (Si), germanium (Ge), silicon germanium (SiGe), gallium arsenide (GaAs), glass, plastic, or ceramic.

Figure 11G:
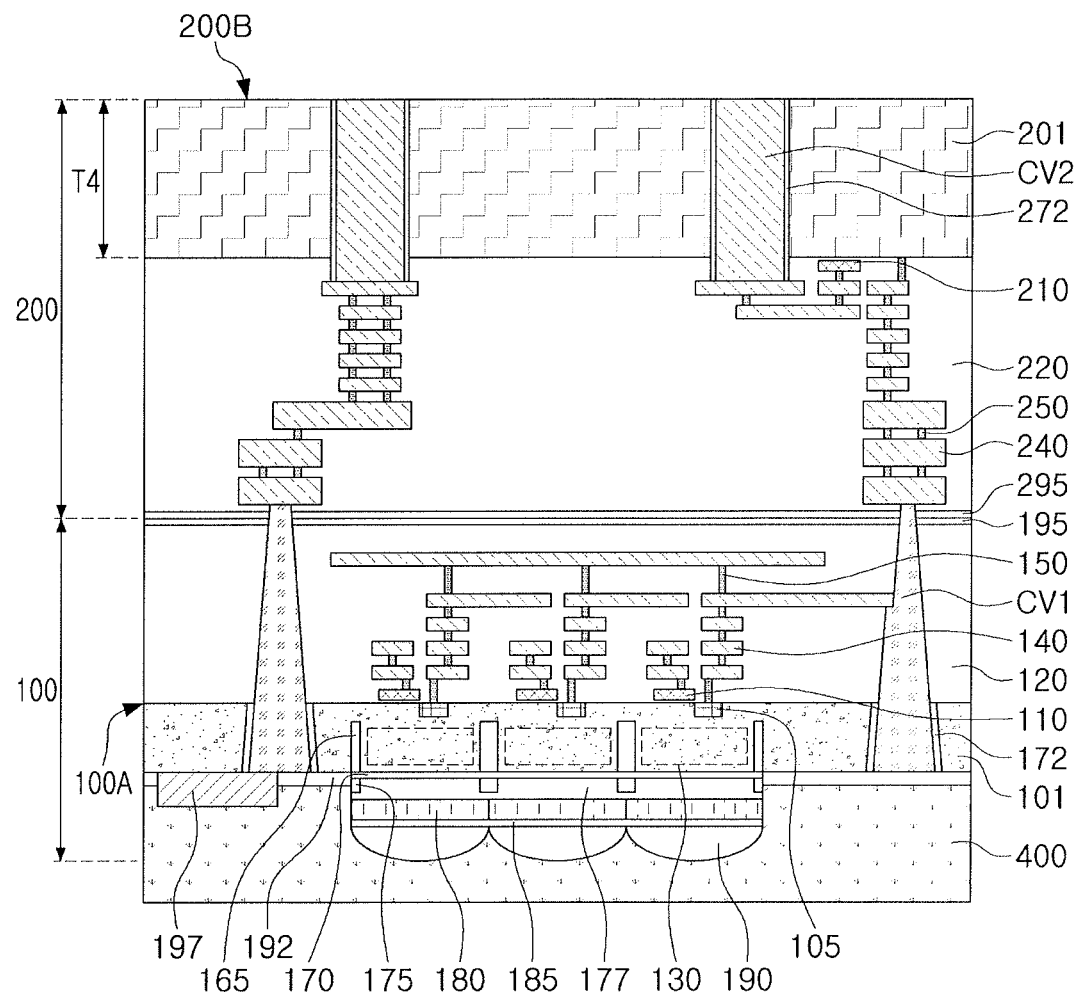

Referring to FIGS. 10B and 11G, the second connection vias CV2 may be exposed by removing a portion of the second substrate structure 200 (S162). A portion of the second substrate 201 may be removed from the second substrate structure 200, and the second substrate 201 may be thinned from an upper surface corresponding to the second surface 200B of the second substrate structure 200. Accordingly, the second substrate 201 may have a fourth thickness T4 less than the second thickness T2 of FIG. 11B.

Figure 11H:
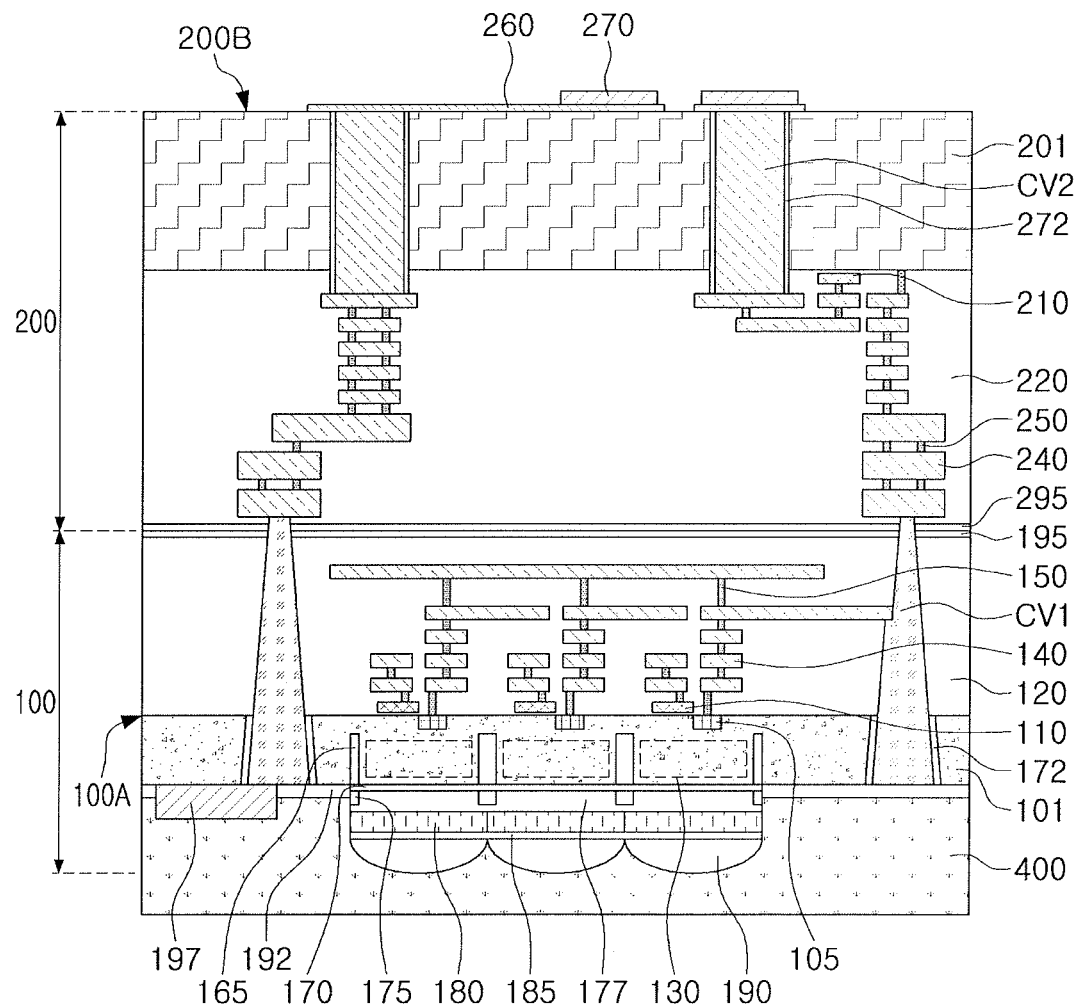

Referring to FIGS. 10B and 11H, first connection pads 270, connected to the exposed second connection vias CV2, may be formed (S163). In addition to the first connection pads 270, the first redistribution insulating layer 262 or 262a, the first redistribution layer 260 or 260a, and the first passivation layer 265 or 265a, described above with reference to FIGS. 4A and 4B, may be formed in the process.

Figure 11I:
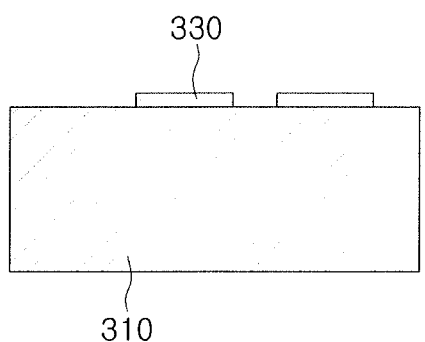

Referring to FIGS. 10B and 11I, a semiconductor chip, having second connection pads 330 formed on one surface thereof, may be prepared (S164). The semiconductor chip may include a memory chip 310. The memory chip 310 may be a tested chip, and may have the second connection pads 330 formed on an upper surface of the memory chip 310. In addition to the second connection pads 330, redistribution layers, for example, the second redistribution insulating layer 352, the second redistribution layer 351, and the third redistribution insulating layer 362 or 362a, the third redistribution layer 360 or 360a, and the second passivation layer 365 or 365a, described above with reference to FIGS. 4A and 4B, may be formed in the process.

Figure 11J:
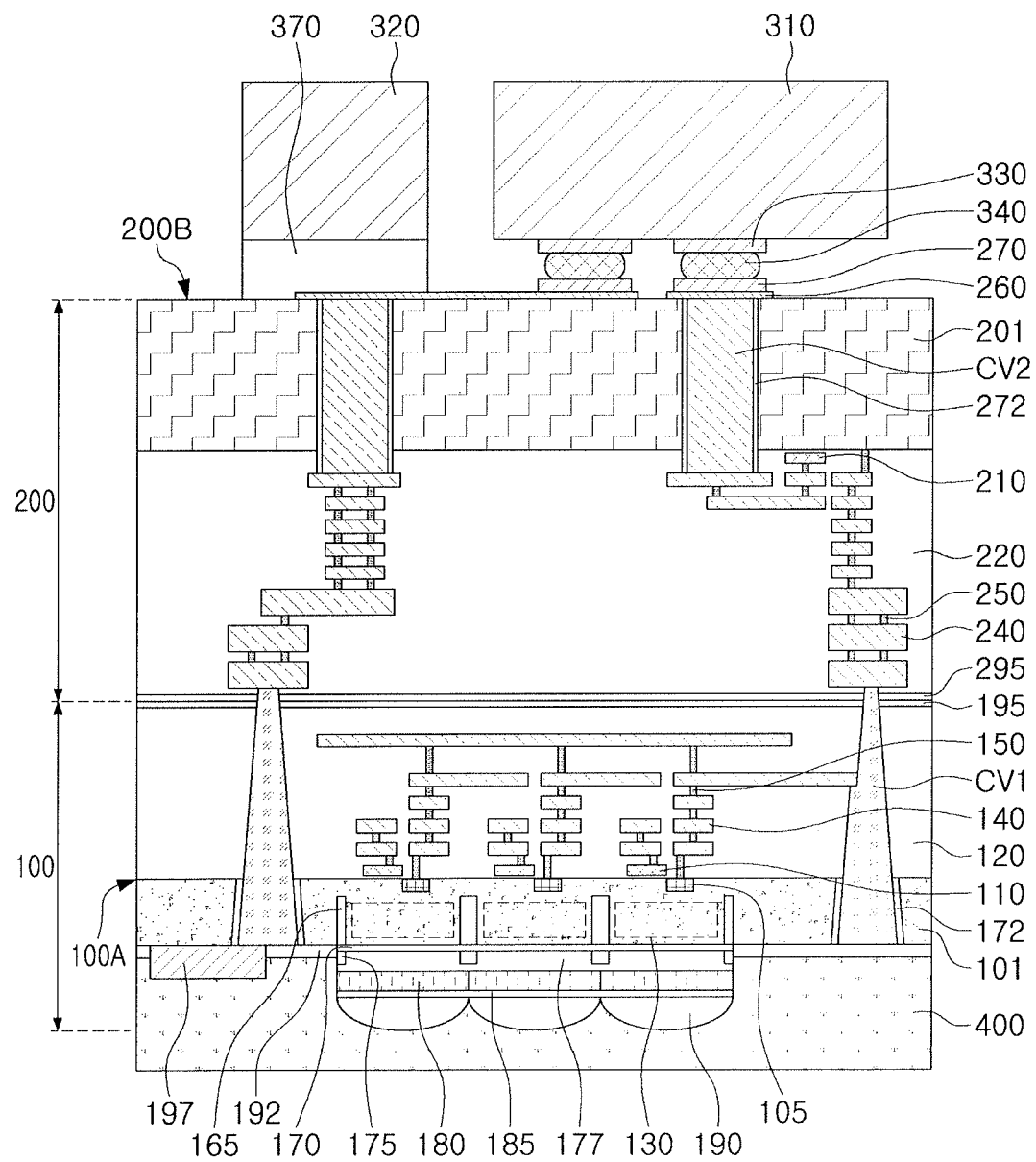

Referring to FIGS. 10B and 11J, the semiconductor chip may be connected to the second substrate structure 200, using bumps 340 (S165). The first connection pad 270 and the second connection pad 330 may be connected using the bumps 340, and thus the memory chip 310 may be mounted on a stack structure of the first and second substrate structures 100 and 200. In the process, a dummy chip 320 may be mounted together with the memory chip 310, and may be connected to the second substrate 201 by a bonding layer 370. The dummy chip 320 may also be connected to the second substrate 201, using a dummy bump, in a manner similar to that of mounting the memory chip 310. The image sensing apparatus 10c, described above with reference to FIG. 8, may be fabricated by mounting a logic chip 320a in the same manner as that of mounting the memory chip 310 in the process.

Figure 11K:
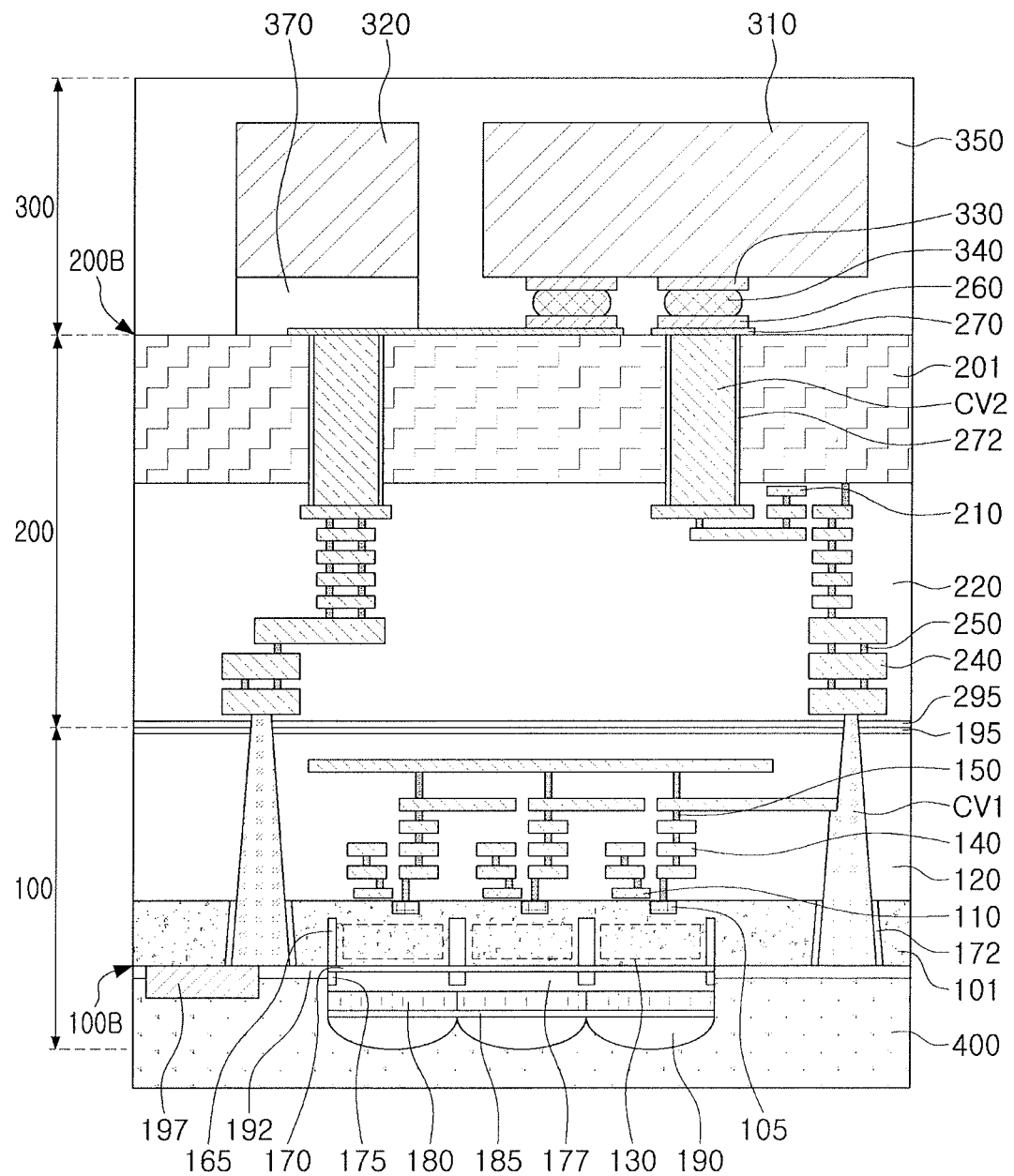

Referring to FIGS. 10B and 11K, an encapsulation portion 350 may be formed to encapsulate the semiconductor chip (S166). The encapsulation portion 350 may cover the memory chip 310 and the dummy chip 320, and may fill a space between the bumps 340. In example embodiments, the encapsulation portion 350 may have a multilayer structure, and may include an under-fill portion filling the space between the bumps 340.

Figure 11L:
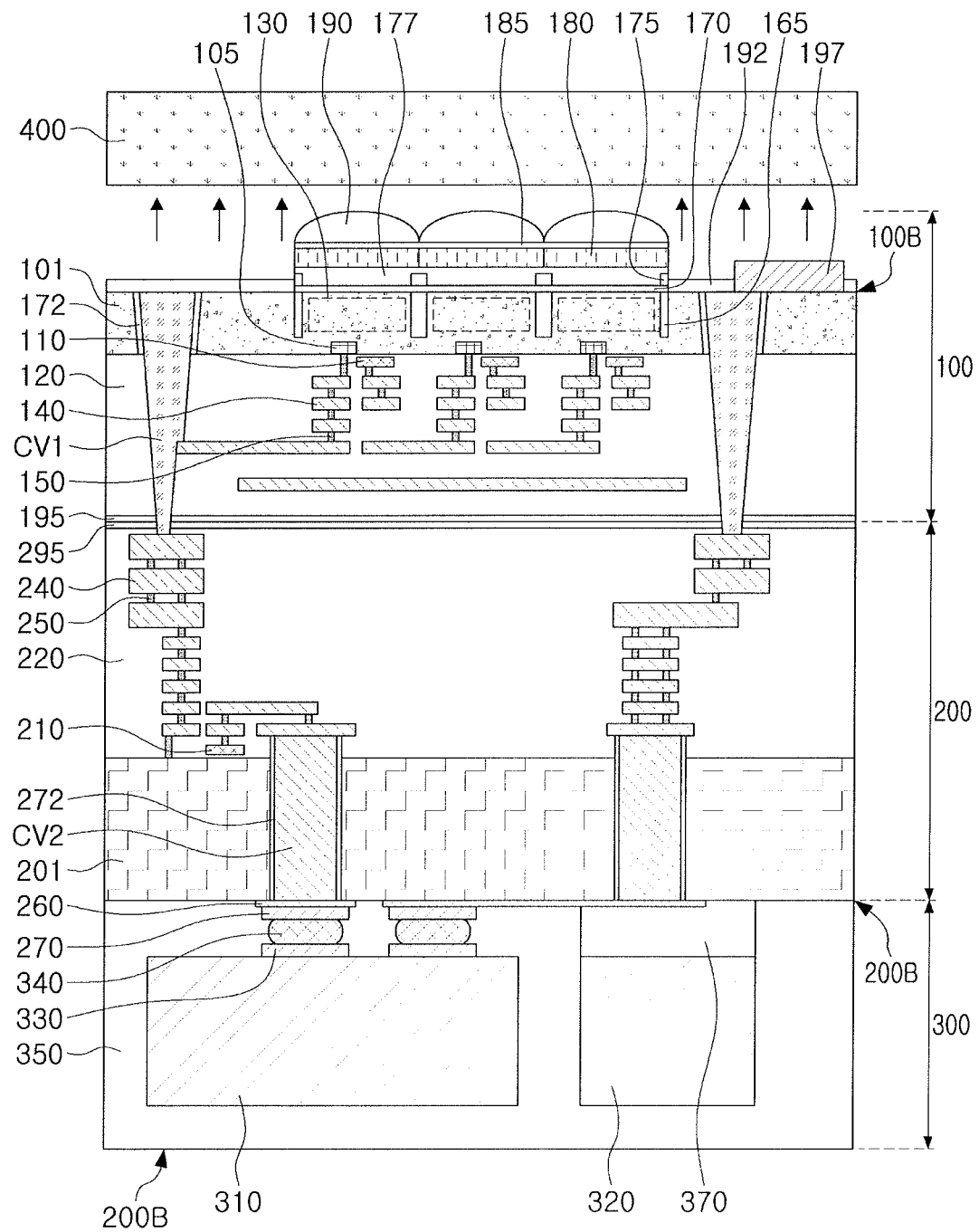

Referring to FIGS. 10B and 11L, the carrier substrate 400 may be removed from the first substrate structure 100 (S167). After the carrier substrate 400 is detached from the first substrate structure 100, a bonding layer used in bonding the carrier substrate 400 may be removed, and a cleaning process may be performed. In example embodiments, a test process for an image sensing apparatus, including the memory chip 310, may further be performed.

Referring to FIGS. 3 and 10B, a portion of the encapsulation portion 350 may be removed, such that one surface of the semiconductor chip may be exposed (S168). The portion of the encapsulation portion 350 may be removed by a grinding process, whereby lower surfaces of the memory chip 310 and the dummy chip 320 may be exposed.

Referring to FIGS. 3 and 10A, a process of separating the stack structure of the first and second substrate structures 100 and 200, having the semiconductor chip mounted thereon, into unit image sensing apparatuses 10 may be performed (S170).

First, the stack structure of the first and second substrate structures 100 and 200, having the memory chip 310 mounted thereon, may be separated into the unit image sensing apparatuses 10 by a blade cutting process or a laser cutting process.

Figure 12A:
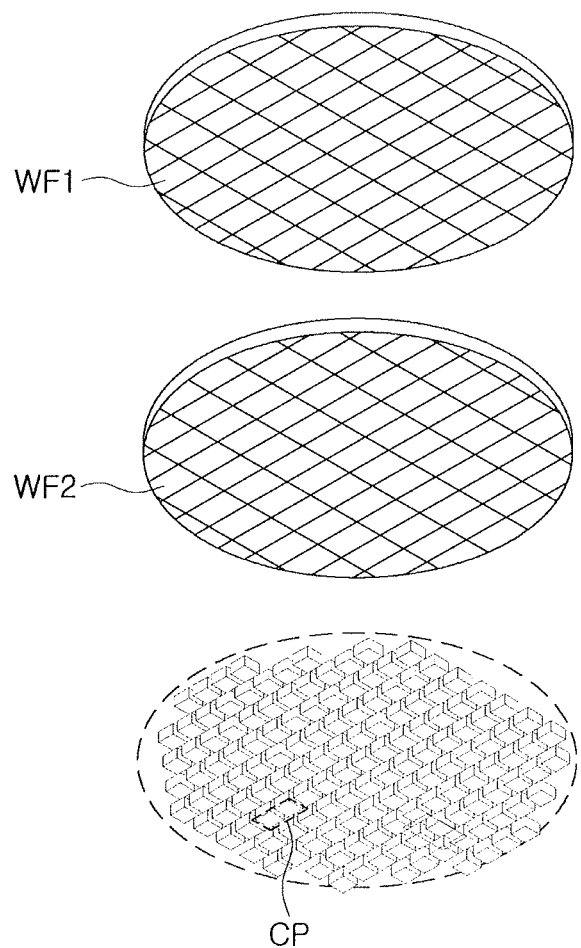
FIGS. 12A and 12B illustrate views of a method of manufacturing an image sensing apparatus, according to example embodiments.
Figure 12B:
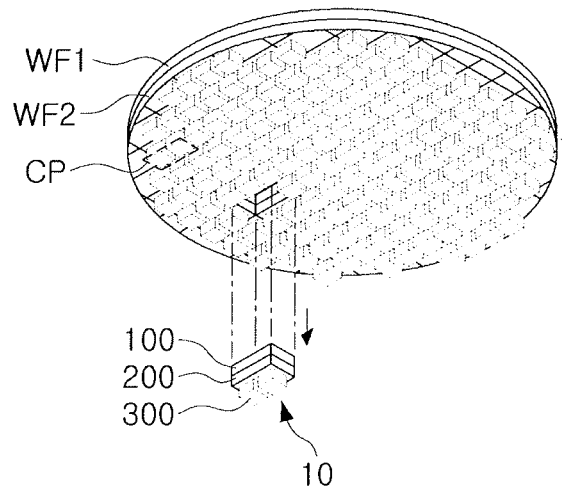

FIGS. 12A and 12B are views of a method of manufacturing an image sensing apparatus, according to example embodiments.

Referring to FIGS. 12A and 12B, the method of manufacturing an image sensing apparatus, described above with reference to FIGS. 11A through 11L, is schematically illustrated on a wafer scale. A first wafer WF1 may be a wafer including the first substrate structure 100 of FIG. 3, for example, in plurality. A second wafer WF2 may be a wafer including the second substrate structure 200 of FIG. 3, for example, in plurality. Chips CP may include the memory chip 310 and the dummy chip 320 of FIG. 3.

As illustrated in FIG. 12A, the first wafer WF1 and the second wafer WF2 may be bonded on a wafer level. The chips CP may be bonded to the second wafer WF2 in a chip on wafer (COW) manner. Subsequently, as illustrated in FIG. 12B, the first wafer WF1, the second wafer WF2, and the chips CP may be separated into image sensing apparatuses 10 in a bonding state. Each of the respectively separated image sensing apparatuses 10 may include the first substrate structure 100, the second substrate structure 200, and the third chip structure 300.

Figure 13A:
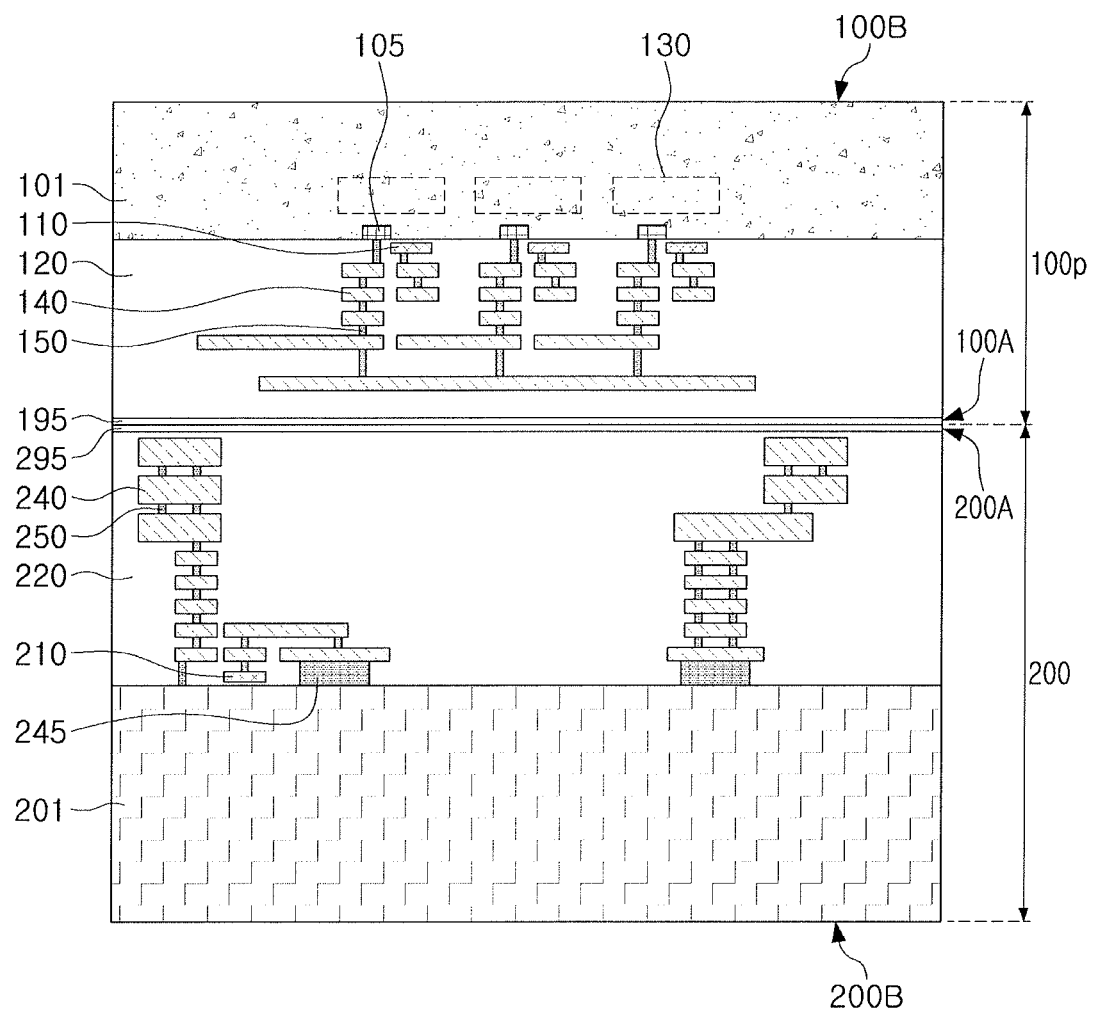
FIGS. 13A, 13B, and 13C illustrate schematic cross-sectional views of a method of manufacturing an image sensing apparatus, according to example embodiments.
Figure 13B:
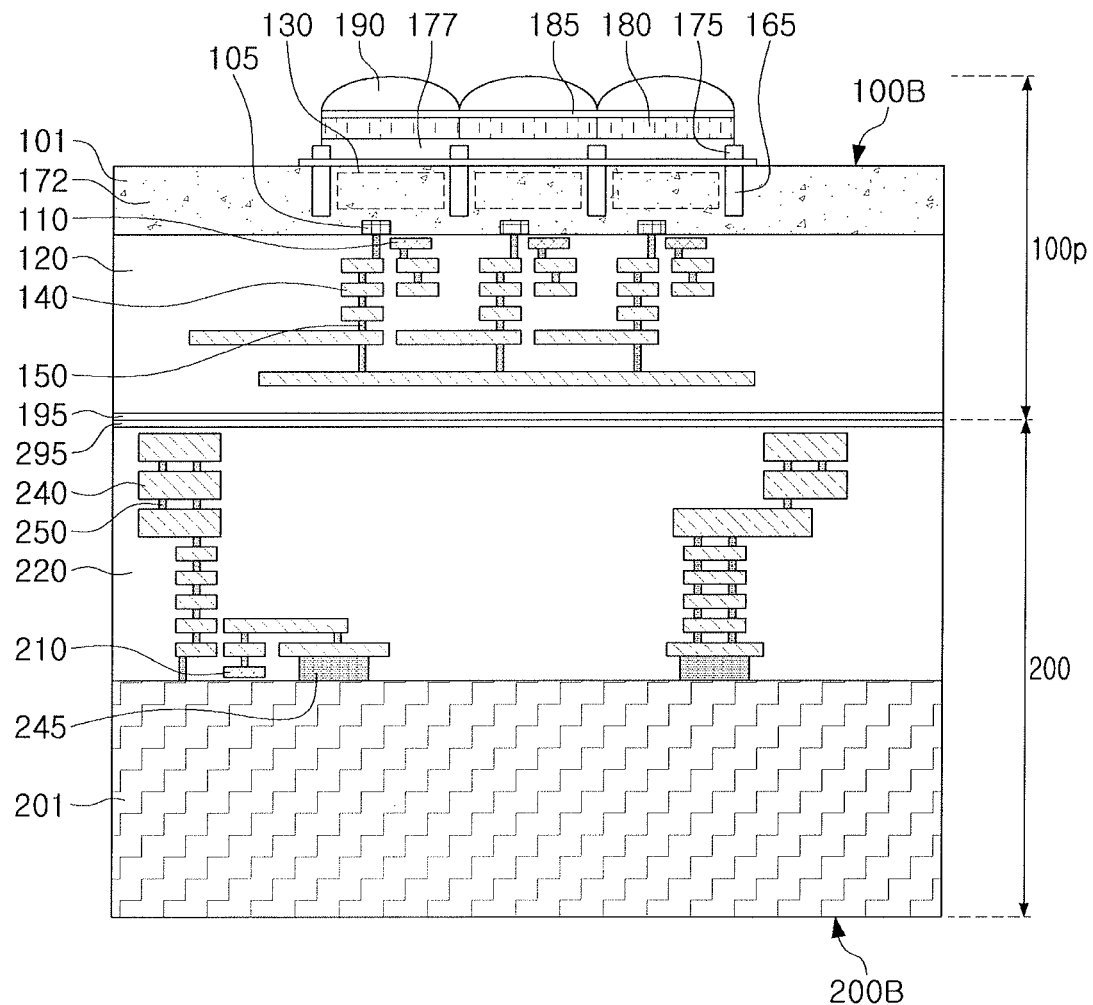
Figure 13C:
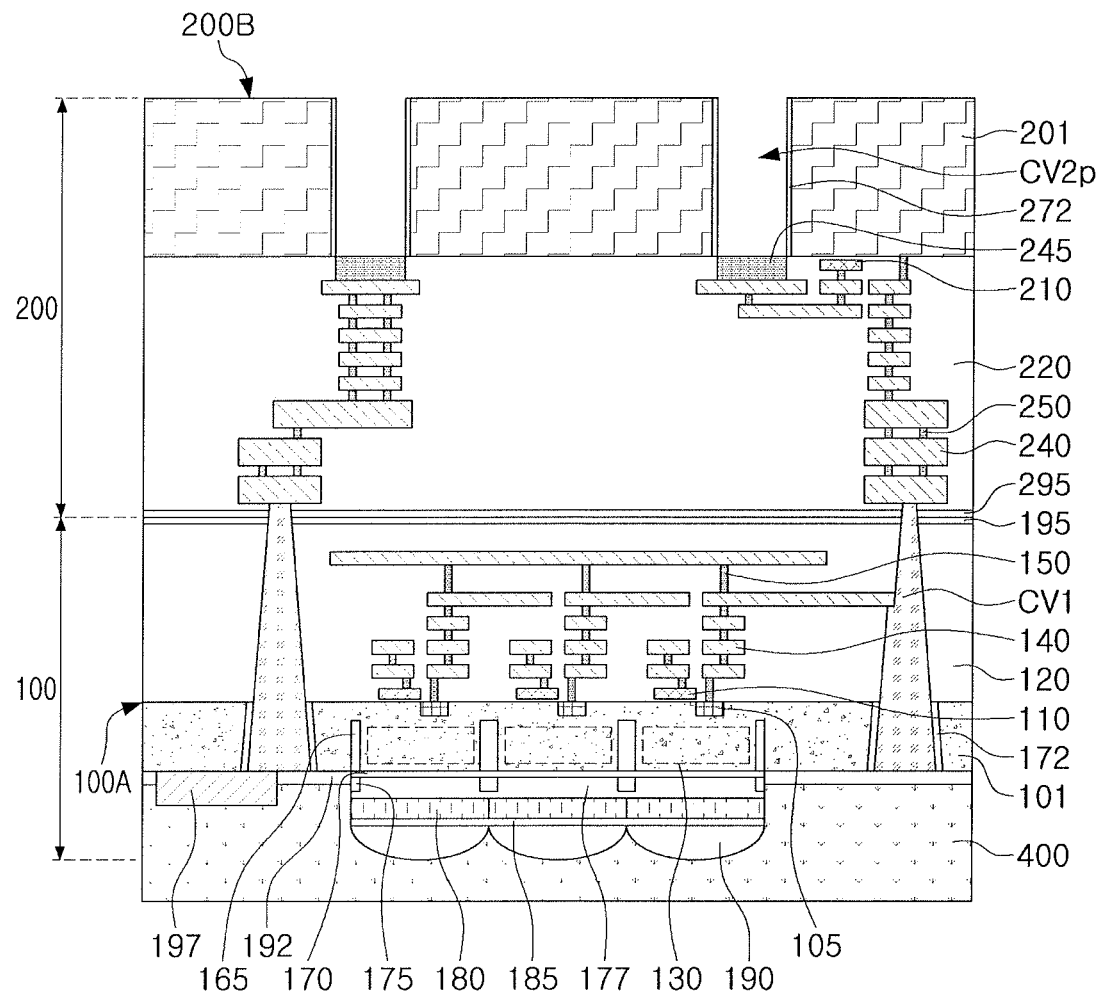

FIGS. 13A through 13C are schematic cross-sectional views of a method of manufacturing an image sensing apparatus, according to example embodiments. Relative to the process described above with reference to FIG. 11B, FIGS. 13A through 13C illustrate a process of forming the second connection vias CV2 by a via-last process, subsequent to bonding the first substrate 101 to the second substrate 201 (S130).

Referring to FIG. 13A, while only the circuit region is formed on the second substrate structure 200 in S120, described above with reference to FIG. 11B, the first substrate structure 100p and the second substrate structure 200 may be bonded (S130).

Referring to FIG. 13B, as described above with reference to FIG. 11D, the second region of the pixel region may be formed on one surface of the first substrate structure 100p (S140).

Referring to FIG. 13C, as described above with reference to FIGS. 11E through 11G, the first connection vias CV1 may be formed to extend from the one surface of the first substrate structure 100p (S150), the carrier substrate 400 may be bonded to one surface of the first substrate structure 100 (S161), and a portion of the second substrate 201 may be removed. Subsequently, via holes CV2p may be formed within the second substrate structure 200, in order to form the second connection vias CV2. The via holes CV2p may be sequentially filled with an insulating material and a conductive material to form the second via insulating layers 272 and the second connection vias CV2.

Subsequently, the processes, described above with reference to FIGS. 11H through 11L, may be performed in the same manner.

Figure 14:
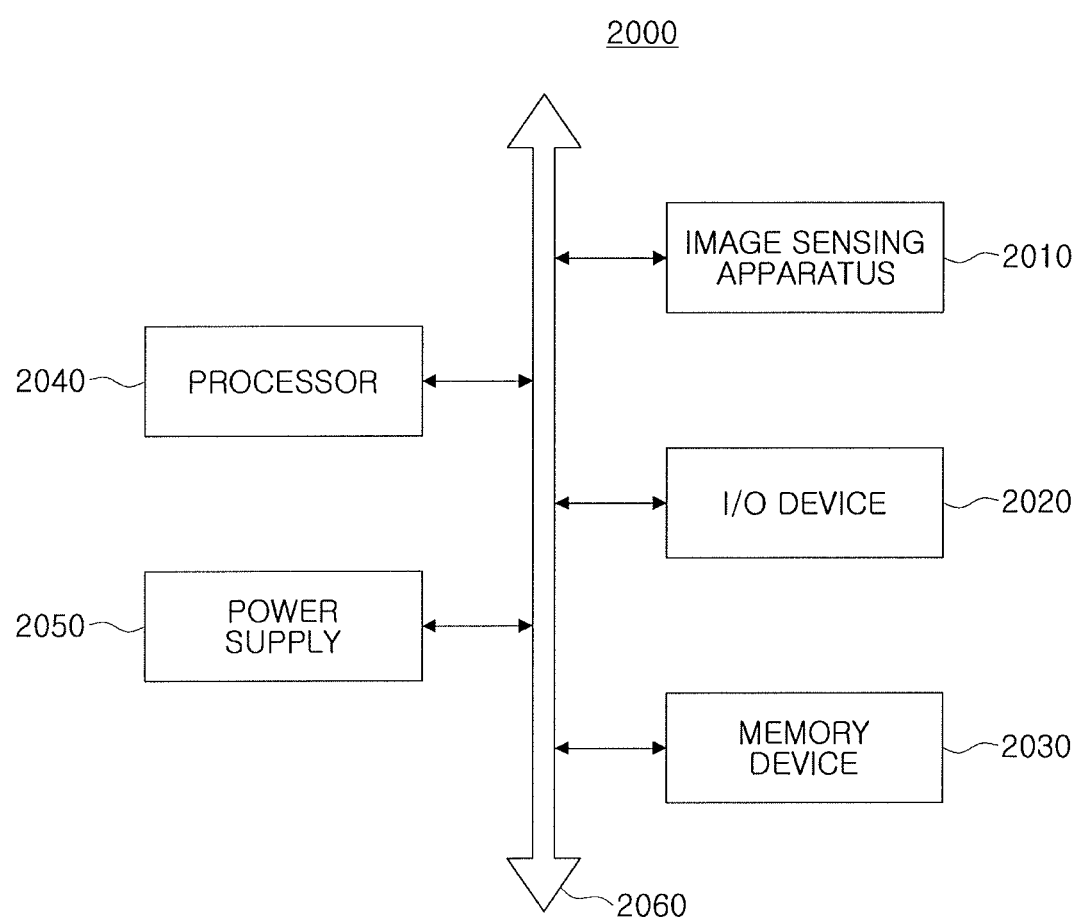
FIG. 14 illustrates a block diagram of a system including an image sensing apparatus, according to example embodiments.

FIG. 14 illustrates a block diagram of a system including an image sensing apparatus, according to example embodiments.

Referring to FIG. 14, a system 2000 may be any one of a computing system, a camera system, a scanner, a vehicle navigation device, a video phone, a security system, or a motion detection system that may require image data.

The system 2000 may include an image sensing apparatus 2010, an input/output (I/O) device 2020, a memory device 2030, a processor 2040, and a power supply 2050. The system 2000 may further include ports that may communicate with a video card, a sound card, a memory card, a universal serial bus (USB) device, or with other electronic devices.

The processor 2040 may perform specific arithmetic operations, or tasks. According to an example embodiment, the processor 2040 may be a microprocessor or a central processing unit (CPU). The processor 2040 may communicate with the image sensing apparatus 2010, the memory device 2030, and the I/O device 2020 via a bus 2060. According to an example embodiment, the processor 2040 may be connected to an expansion bus, such as a peripheral component interconnect (PCI) bus.

The image sensing apparatus 2010 may also have an image sensor and a memory which may be provided as a single independent semiconductor chip. The image sensing apparatus 2010 may be fabricated or provided according to the example embodiments described above with reference to FIGS. 1 through 13C.

The I/O device 2020 may include an input device, such as a touch screen, a keyboard, a keypad, or a mouse, and an output device, such as a printer or a display. The memory device 2030 may store data for operations of the system 2000. For example, the memory device 2030 may be provided as a dynamic random access memory (DRAM), a mobile DRAM, a static random access memory (SRAM), a phase change random access memory (PRAM), a ferroelectric random access memory (FRAM), a resistance random access memory (RRAM), and/or a magnetic random access memory (MRAM). In addition, the system 2000 may further include a storage device, such as, a solid-state drive (SSD), a hard disk drive (HDD), or a compact disk-read only memory (CD-ROM). The power supply 2050 may supply an operating voltage required for operations of the system 2000.

As set forth above, embodiments may provide an image sensing apparatus that may have a compact size and improved image processing speed, and a method of manufacturing the same. The image sensing apparatus may include a stack of a pixel region, a circuit region, and a semiconductor chip.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an image sensing apparatus, the method comprising:
   forming a first substrate structure including a first region of a pixel region, the first substrate structure having a first surface and a second surface opposite the first surface;
   forming a second substrate structure including a circuit region for driving the pixel region, the second substrate structure having a third surface and a fourth surface opposite the third surface;
   bonding the first substrate structure to the second substrate structure, such that the first surface of the first substrate structure is connected to the third surface of the second substrate structure;
   forming a second region of the pixel region on the second surface of the first substrate structure;
   forming a first connection via, the first connection via extending from the second surface of the first substrate structure to pass through the first substrate structure;
   mounting semiconductor chips on the fourth surface of the second substrate structure, using a conductive bump; and
   separating a stack structure of the first substrate structure, the second substrate structure, and the semiconductor chips into unit image sensing apparatuses.

2. The method as claimed in claim 1, further comprising: forming a second connection via passing through a portion of the second substrate structure.

3. The method as claimed in claim 2, wherein the forming of the second connection via is performed prior to the bonding of the first substrate structure to the second substrate structure, and further includes exposing the second connection via by removing a portion of the second substrate structure from the fourth surface, subsequent to the bonding of the first substrate structure to the second substrate structure.

4. The method as claimed in claim 2, wherein the forming of the second connection via is performed subsequent to the bonding of the first substrate structure to the second substrate structure.

5. The method as claimed in claim 1, further comprising:
   bonding a carrier substrate to the second surface of the first substrate structure, subsequent to the bonding of the first substrate structure to the second substrate structure; and
   removing the carrier substrate from the second surface of the first substrate structure.

6. The method as claimed in claim 1, further comprising: forming a redistribution layer and a conductive connection pad on the fourth surface of the second substrate structure, the conductive connection pad being disposed on the redistribution layer and connected to the conductive bump, prior to the mounting of the semiconductor chips.

7. The method as claimed in claim 1, further comprising: forming an encapsulation portion encapsulating the semiconductor chips.

8. The method as claimed in claim 7, further comprising: removing a portion of the encapsulation portion, such that one surface of the semiconductor chips are exposed.

9. The method as claimed in claim 1, wherein the semiconductor chips include:
   a redistribution layer disposed on a surface, connected to the fourth surface of the second substrate structure; and
   a connection pad disposed on the redistribution layer and connected to the conductive bump.

10. The method as claimed in claim 1, wherein the mounting of the semiconductor chips includes mounting dummy chips, electrically isolated from the circuit region, together with the semiconductor chips.

11. The method as claimed in claim 1, wherein the mounting of the semiconductor chips includes mounting logic chips, electrically connected to the circuit region, together with the semiconductor chips.

12. The method as claimed in claim 1, wherein the second substrate structure includes:
   a second substrate having elements disposed thereon to form the circuit region; and
   an interlayer insulating layer disposed on the second substrate and having a wiring structure disposed therein,
   wherein the first connection via extends to a portion of the interlayer insulating layer.

13. The method as claimed in claim 12, further comprising: forming a second connection via passing through a portion of the second substrate structure,
   wherein the second connection via passes through the second substrate, and is connected to the wiring structure disposed in the interlayer insulating layer.

14. The method as claimed in claim 13, wherein the first connection via and the second connection via are disposed in different positions on a plane.

15. The method as claimed in claim 1, wherein:
   the first substrate structure includes a first substrate, the first substrate having a photoelectric conversion element, and having a fifth surface and a sixth surface,
   the first region of the pixel region includes a region formed from the fifth surface of the first substrate, and
   the second region of the pixel region includes a region formed from the sixth surface of the first substrate.

16. A method of manufacturing an image sensing apparatus, the method comprising:
forming a first substrate structure including a photoelectric conversion element in a pixel region, the first substrate structure having a first surface and a second surface opposite the first surface;
forming a second substrate structure including a circuit region for driving the pixel region, the second substrate structure having a third surface and a fourth surface opposite the third surface;
bonding the first substrate structure to the second substrate structure, such that the first surface of the first substrate structure is connected to the third surface of the second substrate structure;
forming a color filter and a microlens of the pixel region on the second surface of the first substrate structure; and
mounting semiconductor chips on the fourth surface of the second substrate structure, using a conductive bump.

17. The method as claimed in claim 16, wherein the mounting of the semiconductor chips includes:
bonding a carrier substrate to the second surface of the first substrate structure;
removing a portion of the second substrate structure from the fourth surface;
forming a redistribution layer and a conductive connection pad on the fourth surface of the second substrate structure, the conductive connection pad being disposed on the redistribution layer and connected to the conductive bump;
connecting the semiconductor chips on the fourth surface of the second substrate structure, using the conductive bump;
forming an encapsulation portion encapsulating the semiconductor chips; and
removing the carrier substrate from the second surface of the first substrate structure.

18. The method as claimed in claim 16, wherein the bonding of the first substrate structure to the second substrate structure includes:
forming a first metal connection portion on the first surface of the first substrate structure;
forming a second metal connection portion on the third surface of the second substrate structure; and
bonding the first metal connection portion to the second metal connection portion.

19. The method as claimed in claim 18, wherein the first metal connection portion and the second metal connection portion each have a columnar shape, and the first substrate structure and the second substrate structure are electrically connected by the first metal connection portion and the second metal connection portion.

20. A method of manufacturing an image sensing apparatus, the method comprising:
forming a stack structure of a first substrate structure and a second substrate structure, the first substrate structure including a pixel region, and the second substrate structure including a circuit region for driving the pixel region;
bonding a carrier substrate to one surface of the first substrate structure;
removing a portion of the second substrate structure from one surface of the second substrate structure;
forming a redistribution layer and a conductive connection pad disposed on the redistribution layer, on the one surface of the second substrate structure;
connecting semiconductor chips on the one surface of the second substrate structure, using a conductive bump;
forming an encapsulation portion encapsulating the semiconductor chips;
removing the carrier substrate from the one surface of the first substrate structure; and
separating a stack structure of the first substrate structure, the second substrate structure, and the semiconductor chips into unit image sensing apparatuses.

* * * * *